United States Patent
Wajiki et al.

(10) Patent No.: US 11,400,480 B2
(45) Date of Patent: Aug. 2, 2022

(54) SUBSTRATE PROCESSING APPARATUS AND SUBSTRATE PROCESSING METHOD

(71) Applicant: SCREEN HOLDINGS CO., LTD., Kyoto (JP)

(72) Inventors: Takehiro Wajiki, Kyoto (JP); Tadashi Miyagi, Kyoto (JP); Tsuyoshi Mitsuhashi, Kyoto (JP)

(73) Assignee: SCREEN Holdings Co., Ltd.

( * ) Notice: Subject to any disclaimer, the term of this patent is extended or adjusted under 35 U.S.C. 154(b) by 923 days.

(21) Appl. No.: 15/999,797

(22) PCT Filed: Feb. 3, 2017

(86) PCT No.: PCT/JP2017/004036
§ 371 (c)(1),
(2) Date: Aug. 17, 2018

(87) PCT Pub. No.: WO2017/141738
PCT Pub. Date: Aug. 24, 2017

(65) Prior Publication Data
US 2021/0213480 A1    Jul. 15, 2021

(30) Foreign Application Priority Data
Feb. 17, 2016 (JP) .............................. JP2016-028013

(51) Int. Cl.
*B05C 5/02* (2006.01)
*B05C 11/00* (2006.01)
(Continued)

(52) U.S. Cl.
CPC ................ *B05C 5/02* (2013.01); *B05C 11/00* (2013.01); *B05C 11/1023* (2013.01);
(Continued)

(58) Field of Classification Search
USPC ................. 118/641–643, 712, 689, 326, 686
See application file for complete search history.

(56) References Cited

U.S. PATENT DOCUMENTS

| 5,143,552 A | 9/1992 | Moriyama ..................... 118/666 |
| 6,002,572 A | 12/1999 | Hirose et al. ................. 361/213 |

(Continued)

FOREIGN PATENT DOCUMENTS

| CN | 103247554 A | 8/2013 |
| CN | 105206526 A | 12/2015 |

(Continued)

OTHER PUBLICATIONS

Office Actign dated Oct. 29, 2019 in counterpart Japanese Patent Application No. 2016-028013.
(Continued)

*Primary Examiner* — Yewebdar T Tadesse
(74) *Attorney, Agent, or Firm* — Ostrolenk Faber LLP

(57) ABSTRACT

In a substrate processing apparatus, neutralization processing is performed on a substrate by a neutralization device provided in a thermal processing section. In the neutralization device, at least one of a holder that holds the substrate and an emitter that emits vacuum ultraviolet rays is moved relative to another one in one direction. At this time, one surface of the substrate is irradiated with the vacuum ultraviolet rays emitted by the emitter. When the entire one surface of the substrate is irradiated with the vacuum ultraviolet rays, the neutralization processing ends. Thereafter, the substrate on which the neutralization processing has been performed is transported to a coating processing unit in a coating processing section. In the coating processing unit, a film of a processing liquid is formed on the one surface of the substrate on which the neutralization processing has been performed.

10 Claims, 23 Drawing Sheets

(51) Int. Cl.
  *B05C 11/10* (2006.01)
  *H05F 3/02* (2006.01)
  *G03F 7/16* (2006.01)
  *H05F 3/06* (2006.01)

(52) U.S. Cl.
  CPC .............. *G03F 7/162* (2013.01); *G03F 7/168* (2013.01); *H05F 3/06* (2013.01)

(56) References Cited

U.S. PATENT DOCUMENTS

| | | | |
|---|---|---|---|
| 6,146,135 A | 11/2000 | Watanabe et al. | 432/221 |
| 6,456,480 B1 | 9/2002 | Hirose et al. | 361/213 |
| 2002/0090447 A1 | 7/2002 | Yamaguchi | 427/8 |
| 2003/0032302 A1 | 2/2003 | Nishi et al. | 438/758 |
| 2003/0073278 A1 | 4/2003 | Ohmi et al. | 438/225 |
| 2004/0218315 A1 | 11/2004 | Mizuno et al. | 361/1 |
| 2005/0022840 A1 | 2/2005 | Kobayashi | 134/1.3 |
| 2005/0206018 A1 | 9/2005 | Ohmi et al. | 257/E21 |
| 2006/0279897 A1 | 12/2006 | Mizuno et al. | 361/220 |
| 2011/0090612 A1 | 4/2011 | Oikawa et al. | 361/226 |
| 2013/0203189 A1 | 8/2013 | Kaneda | 438/16 |
| 2013/0258299 A1 | 10/2013 | Nishimura et al. | 355/27 |
| 2015/0037911 A1 | 2/2015 | Kaneda | 438/7 |
| 2015/0062545 A1 | 3/2015 | Muramatsu et al. | 355/30 |
| 2015/0371894 A1 | 12/2015 | Kaneda et al. | |
| 2016/0282725 A1* | 9/2016 | Miyagi | G03F 7/708 |
| 2017/0047233 A1 | 2/2017 | Kaneda et al. | |
| 2018/0068754 A1* | 3/2018 | Dylewicz | H01L 21/67051 |

FOREIGN PATENT DOCUMENTS

| | | |
|---|---|---|
| JP | 02-001113 A | 1/1990 |
| JP | 05-047650 A | 2/1993 |
| JP | H07-022530 A | 1/1995 |
| JP | 10-326767 A | 12/1998 |
| JP | 2845400 B2 | 1/1999 |
| JP | 11-267597 A | 10/1999 |
| JP | 2000-114349 A | 4/2000 |
| JP | 2001-060609 A | 3/2001 |
| JP | 2001-160580 A | 6/2001 |
| JP | 2001-179198 A | 7/2001 |
| JP | 2001-358094 A | 12/2001 |
| JP | 2002-143747 A | 5/2002 |
| JP | 2002-231617 A | 8/2002 |
| JP | 2003-124088 A | 4/2003 |
| JP | 3484658 B2 | 1/2004 |
| JP | 2004-319559 A | 11/2004 |
| JP | 3679243 B2 | 8/2005 |
| JP | 2005-279376 A | 10/2005 |
| JP | I242394 B | 10/2005 |
| JP | 2006-173246 A | 6/2006 |
| JP | 2006-209937 A | 8/2006 |
| JP | 3854757 B2 | 12/2006 |
| JP | 2007-242702 A | 9/2007 |
| JP | 4251830 B2 | 4/2009 |
| JP | 2009-259918 A | 11/2009 |
| JP | 4606348 B2 | 1/2011 |
| JP | 2011-256249 A | 12/2011 |
| JP | 4924520 B2 | 4/2012 |
| JP | 2013-232611 A | 11/2013 |
| JP | 2013-232621 A | 11/2013 |
| JP | 2014-149392 A | 8/2014 |
| JP | 5890255 B2 | 3/2016 |
| JP | 2016-183990 A | 10/2016 |
| WO | WO 2012/026482 A1 | 3/2012 |

OTHER PUBLICATIONS

International Search Report dated Apr. 4, 2017 in corresponding PCT International Application No. PCT/JP2017/004036.
Written Opinion dated Apr. 4, 2017 in corresponding PCT International Application No. PCT/JP2017/004036.
Office Action dated Mar. 2, 2022 in corresponding Chinese Patent Application No. 201780007448.8.

* cited by examiner

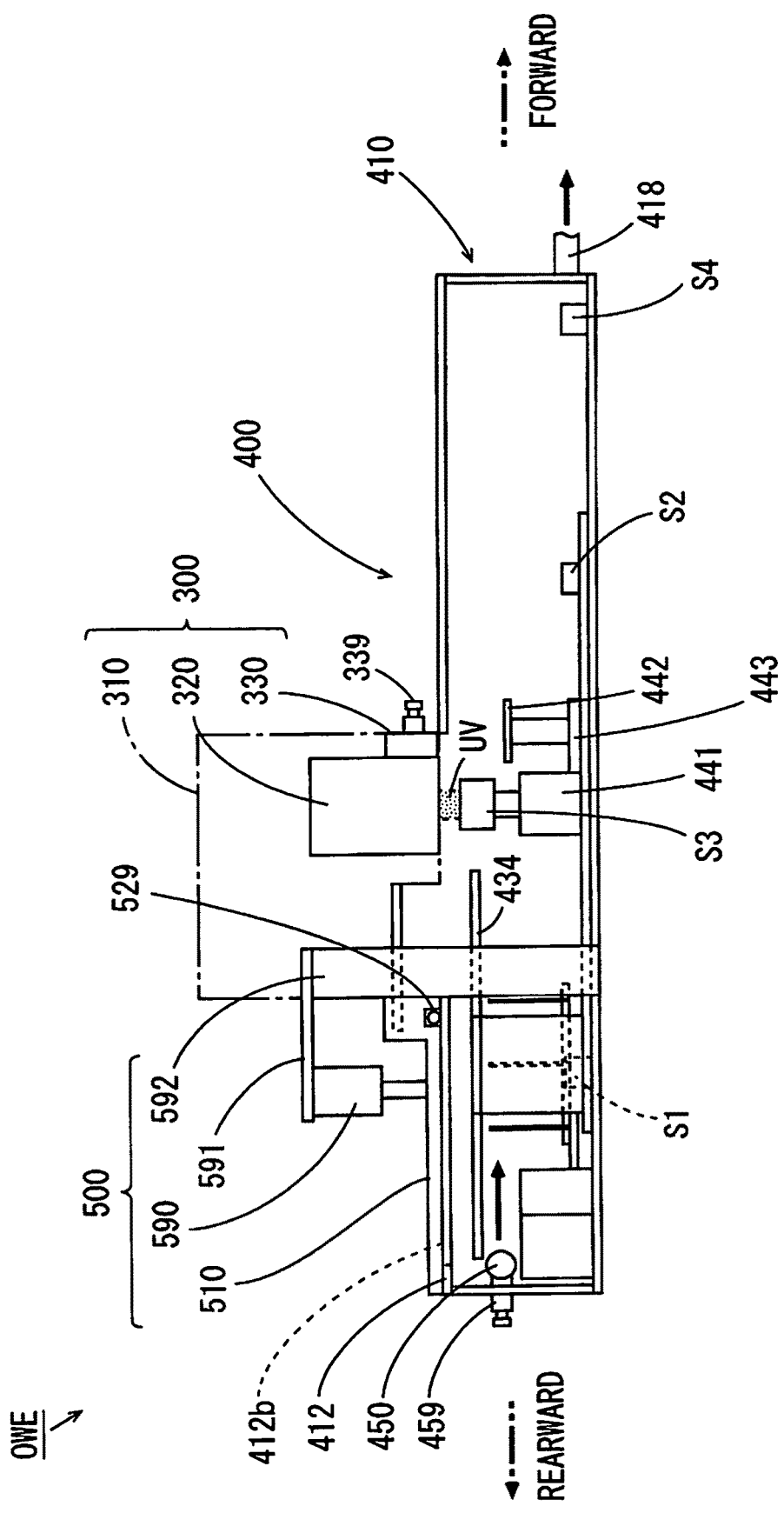

SUBSTRATE PROCESSING APPARATUS AND SUBSTRATE PROCESSING METHOD

CROSS-REFERENCE TO RELATED APPLICATIONS

The present application is a 35 U.S.C. §§ 371 national phase conversion of PCT/JP2017/004036, filed Feb. 3, 2017, which claims priority to Japanese Patent Application No. 2016-028013, filed Feb. 17, 2016, the contents of both of which are incorporated herein by reference. The PCT International Application was published in the Japanese language.

TECHNICAL FIELD

The present invention relates to a substrate processing apparatus and a substrate processing method.

BACKGROUND ART

Substrate processing apparatuses are used to subject various substrates such as semiconductor substrates, substrates for liquid crystal display devices, plasma displays, optical discs, magnetic discs, magneto-optical discs, photomasks and other substrates to various types of processing.

When the substrate is electrically charged in a series of processing performed by a substrate processing apparatus, particles or the like are likely to adhere to the substrate. Further, a wiring trace formed on an obverse surface of the substrate may be damaged by electrical discharge. In order to prevent an occurrence of these defects, a substrate transported by a substrate transport device is neutralized by an ionizer in a substrate processing apparatus described in Patent Document 1.

[Patent Document 1] JP 2000-114349 A

SUMMARY OF INVENTION

Technical Problem

The ionizer described in Patent Document 1 includes a substantially cylindrical outer electrode and an inner electrode provided in its center portion. An AC voltage is applied between the outer electrode and the inner electrode, so that ions are generated. The generated ions are sprayed onto the obverse surface of the substrate held by a holding member of the substrate transport device. Thus, the substrate being transported is neutralized.

In the substrate processing apparatus, it is required to not only reduce adherence of particles or the like to the substrate and an occurrence of electrical discharge but also to further reduce an occurrence of processing detects in the substrate caused by electrification. Therefore, the substrate is preferably neutralized to become as close as possible to 0 (V).

While being capable of reducing the electrical potential of the substrate that is charged to about 1000 (V) to about 100 (V), the above-mentioned ionizer cannot reduce the electrical potential of the substrate charged to about 10 (V) to a value close to 0 (V).

An object of the present invention is to provide a substrate processing apparatus in which an occurrence of a processing defect caused by electrification is prevented, and a substrate processing method of preventing an occurrence of a processing defect caused by electrification.

Solution to Problem (1) A substrate processing apparatus according to one aspect of the present invention includes a neutralizer (an electric charge remover) that performs neutralization (removal of electric charge) processing on a substrate, a coater that applies a processing liquid to one surface of the substrate that has been neutralized by the neutralizer to form a film of the processing liquid on the one surface of the substrate and a controller, wherein the neutralizer includes a holder that holds the substrate in an atmosphere including oxygen molecules, an emitter that emits vacuum ultraviolet rays, and a relative mover that moves at least one of the holder and the emitter relative to another one in one direction, and the controller controls the emitter and the relative mover such that the one surface of the substrate held by the holder is irradiated with the vacuum ultraviolet rays emitted by the emitter through the atmosphere.

In the substrate processing apparatus, the neutralization processing is performed on the substrate by the neutralizer. In the neutralizer, the one surface of the substrate is irradiated with the vacuum ultraviolet rays emitted by the emitter while at least one of the holder that holds the substrate and the emitter is moved relative to the other one in the one direction. At this time, part of the vacuum ultraviolet rays is absorbed by the atmosphere including oxygen molecules. The atmosphere above the one surface of the substrate absorbs part of the vacuum ultraviolet rays, whereby an oxygen molecule included in the atmosphere is decomposed into two oxygen atoms by photodissociation. When an oxygen atom generated by decomposition is coupled with an oxygen molecule present in the surroundings, ozone is generated.

Ozone is a resonance hybrid expressed by superposition of a resonance structure with a positive electrical charge and a resonance structure with a negative electrical charge. Each resonance structure includes a covalent bond and a coordinate bond. Because the coordinate bond is unstable, when the generated ozone comes into contact with the one surface of the electro-positive substrate or the electro-negative substrate, electrical charge is given and received between the ozone and the substrate. In this case, the coordinate bond of the ozone is broken, and an electrical potential of the substrate becomes close to 0 (V). In this manner, the entire substrate is neutralized regardless of an amount of electrical charge of the substrate and polarity of electrification of the substrate.

In the coating processing section, the film of the processing liquid is formed on the one surface of the substrate on which the neutralization processing has been performed. In this case, the electrical potential of the substrate on which the neutralization processing has been performed is substantially 0 (V), so that an occurrence of a processing defect caused by electrification during the coating processing is prevented.

(2) The controller may control relative moving speeds of the holder and the emitter moved by the relative mover such that the substrate is irradiated with a predetermined light amount of the vacuum ultraviolet rays.

In this case, the relative moving speeds of the holder and the emitter are controlled, whereby a light amount of the vacuum ultraviolet rays with which a unit area of the one surface of the substrate is irradiated is adjusted. Thus, an amount of ozone generated above the substrate is adjusted. When the moving speeds are increased, a light amount of the vacuum ultraviolet rays with which the substrate is irradiated is reduced. Thus, an amount of ozone generated above the substrate can be reduced. Further, when the moving speeds are lowered, a light amount of the vacuum ultraviolet rays with which the substrate is irradiated is increased. Thus, an amount of ozone generated above the substrate can be increased. Therefore, a desired amount of ozone can be uniformly supplied onto the one surface of the substrate. As a result, the entire substrate can be uniformly neutralized.

(3) The neutralizer may further include a casing that stores the holder and the substrate held by the holder, a first nitrogen gas supplier that supplies a nitrogen gas into the casing, and a concentration detector that detects an oxygen concentration in the casing, the emitter may be attached to the casing such that the one surface of the substrate held by the holder is irradiated with the emitted vacuum ultraviolet rays in the casing, and the controller may control the emitter and the relative mover such that the substrate is irradiated with the vacuum ultraviolet rays emitted by the emitter when the oxygen concentration detected by the concentration detector is equal to or lower than a predetermined processing concentration.

In this case, the substrate is irradiated with the vacuum ultraviolet rays by the emitter in the atmosphere in which the oxygen concentration is equal to or lower than the predetermined processing concentration. Thus, excessive generation of ozone is suppressed. As a result, an amount of ozone leaked to the outside of the casing is reduced. Further, a nitrogen gas is supplied into the casing, so that a nitrogen gas functions as a catalyst of the three-body reaction of an oxygen molecule and an oxygen atom during generation of ozone. Therefore, an appropriate amount of ozone can be efficiently generated.

(4) The casing may further store the relative mover and may have an upper surface in which an opening is formed, the neutralizer may further include a closing member that is provided to be movable in an up-and-down direction between a first position spaced apart from the opening and a second position at which the closing member closes the opening, an opening closing driver that moves the closing member to the first position or the second position, and a substrate moving mechanism that moves the substrate in a horizontal attitude in the up-and-down direction between a position below the closing member and above the opening, and a position in the casing when the closing member is located at the first position, the relative mover may move the substrate held by the holder in a horizontal direction that is regarded as the one direction in the casing, and the first nitrogen gas supplier may supply a nitrogen gas into the casing when the closing member is located at the second position.

In the above-mentioned configuration, the substrate in a horizontal attitude can be inserted in the horizontal direction into a gap between the closing member and the opening when the closing member is located at the first position. The substrate is moved from a position above the opening to a position inside of the casing through the opening by the substrate moving mechanism. Thereafter, the closing member is lowered from the first position to the second position, so that the opening is closed. In this state, a nitrogen gas is supplied from the first nitrogen gas supplier into the casing, so that an oxygen concentration in the casing is lowered. The one surface of the substrate is irradiated with light by the emitter while the substrate is moved in the horizontal direction by the relative mover. Thus, the entire substrate is neutralized. Thereafter, the closing member is lifted from the second position to the first position, so that the opening is opened. In this state, the substrate is moved to a position above the opening through the opening from the position inside of the casing. Thereafter, the substrate in the horizontal attitude can be taken out in the horizontal direction from the gap between the closing member and the opening.

The above-mentioned configuration enables the casing to be in a hermetic state or an open state by up-down movement of the opening closing member. In this case, it is possible to open and close the opening without sliding the opening closing member and the casing, so that particles are not generated. Further, even when the distance between the opening and the closing member is short, the substrate in the horizontal attitude can be carried in and carried out. Thus, a large space for moving the closing member to an upper portion of the casing is not necessary. Further, leakage of the ozone generated in the casing can be minimized during carry-in and carry-out of the substrate. Further, the substrate in the horizontal attitude can be moved to the inside of the casing, and the substrate in the horizontal attitude can be moved to the outside of the casing, by the up-down movement of the substrate. Further, the substrate in the horizontal attitude can be moved in the horizontal direction in the casing. In this case, the mechanism for moving the substrate is not complicated. As a result, it is possible to neutralize the substrate in the atmosphere having a constant low oxygen concentration without complicating the configuration for carrying in and carrying out the substrate.

(5) A lower surface of the closing member may come into contact with a region surrounding the opening of the upper surface of the casing when the closing member is located at the second position.

In this case, when the opening of the casing is closed by the closing member, a gap between the closing member and the casing is not generated. Thus, a hermetic state in the casing is improved with a simple configuration.

(6) The neutralizer may further include a second nitrogen gas supplier that forms a flow of the nitrogen gas between a lower surface of the closing member and an edge of the opening when the closing member is located at the first position.

In this case, a flow of the nitrogen gas formed by the second nitrogen gas supplier shuts off a flow of an atmosphere between a space below the closing member and outside of the space. Thus, the atmosphere outside of the casing is prevented from entering the casing through the opening, and an amount of ozone generated in the casing that leaks to the outside of the casing through the opening is reduced.

(7) The neutralizer may further include a box that stores the casing and the emitter, and a gas exhaust port that exhausts an atmosphere in the casing.

Thus, even when ozone leaks from the casing, the ozone that has leaked from the casing is exhausted by the gas exhaust port together with the atmosphere in the box. Therefore, the generated ozone is prevented from spreading to the surroundings of the neutralizer.

(8) The neutralizer may further include a third nitrogen gas supplier that supplies a nitrogen gas dispersively to a region above the substrate irradiated with the vacuum ultraviolet rays by the emitter.

In this case, the oxygen concentration in the path of the vacuum ultraviolet rays with which the substrate is irradiated by the emitter can be more sufficiently lowered. Thus, excessive generation of ozone is more sufficiently suppressed. Further, an inert gas is dispersively supplied to a region above the substrate, so that a uniform flow of gas can be formed above the one surface of the substrate. Therefore, the ozone generated above the substrate can be uniformly supplied to the entire one surface of the substrate.

Further, because a nitrogen gas is supplied to a region above the substrate irradiated with the vacuum ultraviolet rays, the supplied nitrogen gas is likely to function as a catalyst of three-body reaction of an oxygen molecule and an oxygen atom. Therefore, an appropriate amount of ozone can be efficiently generated.

(9) The relative mover may move the holder in the one direction, and the emitter may be configured to be able to emit vacuum ultraviolet rays having strip-shape cross sections having a length larger than a diameter of the substrate, and may be arranged such that the vacuum ultraviolet rays emitted from the emitter cross a moving path of the substrate held by the holder.

In this case, the holder holding the substrate moves in the one direction, so that the entire one surface of the substrate is irradiated with the vacuum ultraviolet rays emitted from the emitter. Thus, the entire one surface of the substrate can be irradiated with the vacuum ultraviolet rays with a simple configuration.

(10) The neutralizer may further include an irradiance detector that detects irradiance of the substrate irradiated with light by the emitter, and the controller may calculate moving speeds based on the irradiance detected by the irradiance detector such that a predetermined amount of light is emitted towards the substrate, and may control the relative mover such that the holder and the emitter relatively move at calculated moving speeds.

In this case, the feedback control of the relative moving speeds of the holder and the emitter can be carried out based on the irradiance detected by the irradiance detector such that an appropriate amount of ozone is generated. Thus, the neutralization processing can be more appropriately performed on the substrate.

(11) A substrate processing method according to another aspect of the present invention includes the steps of performing neutralization (removal of electric charge) processing on a substrate, and applying a processing liquid to one surface of the substrate that has been neutralized by the neutralization processing to form a film of the processing liquid on the one surface of the substrate, wherein the step of performing the neutralization processing includes holding the substrate by a holder in an atmosphere including oxygen molecules, emitting vacuum ultraviolet rays by an emitter, and moving at least one of the holder and the emitter relative to another one in one direction such that the one surface of the substrate held by the holder is irradiated with the vacuum ultraviolet rays emitted by the emitter through the atmosphere.

In this substrate processing method, the neutralization processing is performed on the substrate. In the neutralization processing, the one surface of the substrate is irradiated with the vacuum ultraviolet rays emitted from the emitter while at least one of the holder holding the substrate and the emitter is moved relative to the other one in the one direction. At this time, part of the vacuum ultraviolet rays is absorbed by the atmosphere including oxygen molecules. When the atmosphere above the one surface of the substrate absorbs part of the vacuum ultraviolet rays, an oxygen molecule included in the atmosphere is decomposed into two oxygen atoms by photodissociation. An oxygen atom generated by decomposition is coupled with an oxygen molecule present in the surroundings, so that ozone is generated.

When the generated ozone comes into contact with the one surface of the electro-positive substrate or the electro-negative substrate, electrical charge is given and received between the ozone and the substrate. In this case, a coordinate bond of the ozone is broken, and an electrical potential of the substrate becomes close to 0 (V). In this manner, the entire substrate is neutralized regardless of an amount of electrical charge and polarity of electrification of the substrate.

The film of the processing liquid is formed on the one surface of the substrate on which the neutralization processing has been performed. In this case, because an electrical potential of the substrate on which the neutralization processing has been performed is substantially 0 (V), an occurrence of a processing defect caused by electrification during the coating processing is prevented.

Advantageous Effects of Invention

The present invention can prevent an occurrence of a processing defect caused by electrification.

BRIEF DESCRIPTION OF THE DRAWINGS

FIG. 24 is a side view for explaining the irradiance measurement operation performed in the neutralization device.

DESCRIPTION OF EMBODIMENTS

A substrate processing apparatus and a substrate processing method according to one embodiment of the present invention will be described below with reference to drawings. In the following description, a substrate refers to a semiconductor substrate, a substrate for a liquid crystal display device, a substrate for a plasma display, a substrate for an optical disc, a substrate for a magnetic disc, a substrate for a magneto-optical disc, a substrate for a photomask or the like.

[1] Configuration of Substrate Processing Apparatus

Figure 1:
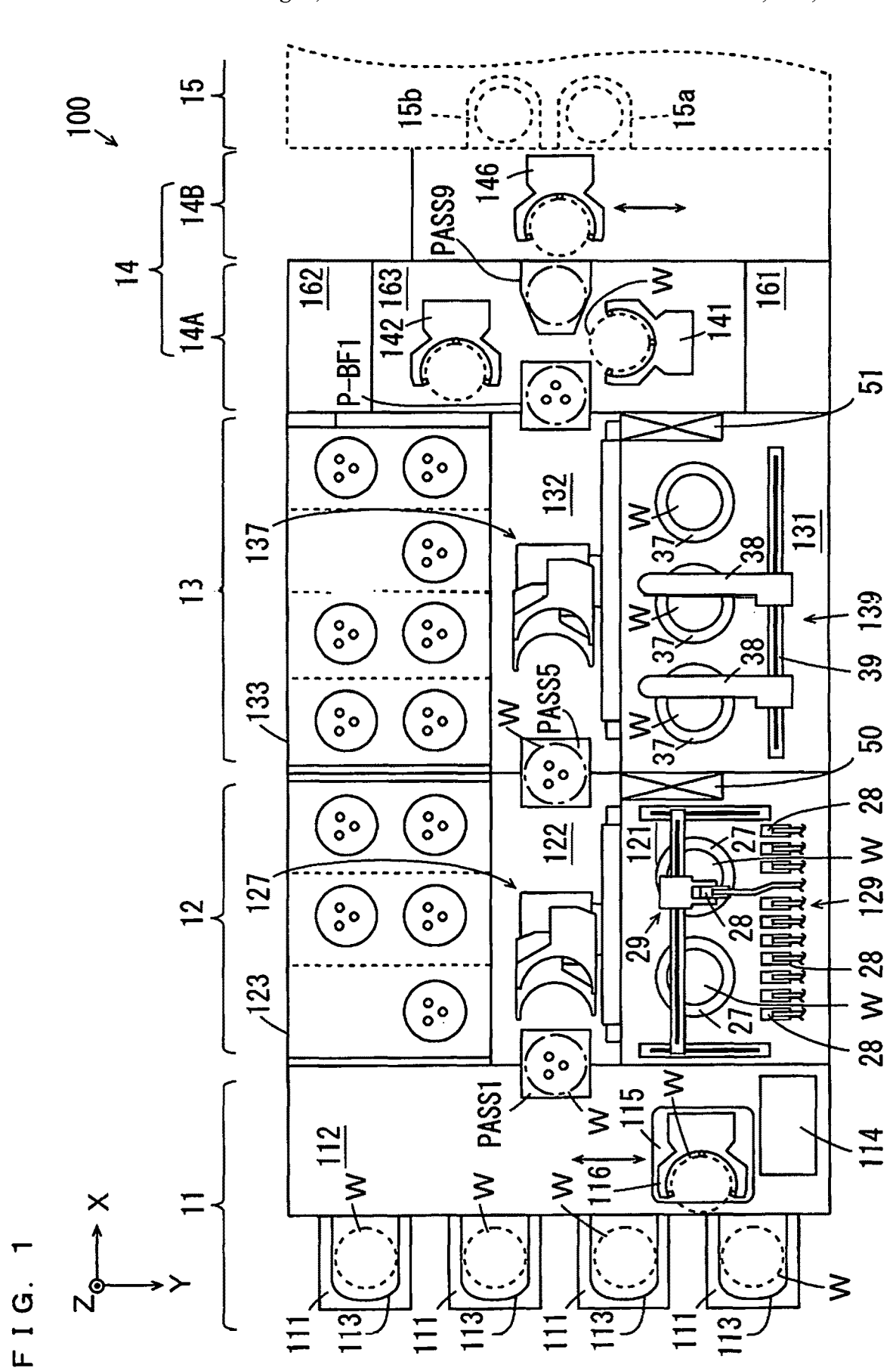
FIG. 1 is a schematic plan view of a substrate processing apparatus according to one embodiment of the present invention.

FIG. 1 is a schematic plan view of the substrate processing apparatus according to one embodiment of the present invention.

FIG. 1 and the subsequent drawings are accompanied by the arrows that indicate X, Y, and Z directions orthogonal to one another for the clarity of a positional relationship. The X and Y directions are orthogonal to each other within a horizontal plane, and the Z direction corresponds to a vertical direction.

As shown in FIG. 1, the substrate processing apparatus 100 includes an indexer block 11, a first processing block 12, a second processing block 13, a cleaning drying processing block 14A and a carry-in carry-out block 14B. An interface block 14 is constituted by the cleaning drying processing block 14A and the carry-in carry-out block 14B. An exposure device 15 is arranged to be adjacent to the carry-in carry-out block 14B. In the exposure device 15, exposure processing is performed on the substrate W with use of a liquid immersion method.

As shown in FIG. 1, the indexer block 11 includes a plurality of carrier platforms 111 and a transport section 112. In each carrier platform 111, a carrier 113 for storing the plurality of substrates W in multiple stages is placed.

In the transport section 112, a controller 114 and a transport mechanism 115 are provided. The controller 114 controls various constituent elements of the substrate processing apparatus 100. The transport mechanism 115 has a hand 116 for holding the substrate W. The transport mechanism 115 transports the substrate W while holding the substrate W by the hand 116.

The first processing block 12 includes a coating processing section 121, a transport section 122 and a thermal processing section 123. The coating processing section 121 and the thermal processing section 123 are provided to be opposite to each other with the transport section 122 interposed therebetween. A substrate platform PASS1 and below-mentioned substrate platforms PASS2 to PASS4 (see FIG. 4) on which the substrates W are placed are provided between the transport section 122 and the indexer block 11. A transport mechanism 127 and a below-mentioned transport mechanism 128 (see FIG. 4), which transport the substrates W, are provided in the transport section 122.

The second processing block 13 includes a coating development processing section 131, a transport section 132 and a thermal processing section 133. The coating development processing section 131 and the thermal processing section 133 are provided to be opposite to each other with the transport section 132 interposed therebetween. A substrate platform PASS5 and below-mentioned substrate platforms PASS6 to PASS8 (see FIG. 4) on which the substrates W are placed are provided between the transport section 132 and the transport section 122. A transport mechanism 137 and a below-mentioned transport mechanism 138 (see FIG. 4), which transport the substrates W, are provided in the transport section 132.

The cleaning drying processing block 14A includes cleaning drying processing sections 161, 162 and a transport section 163. The cleaning drying processing sections 161, 162 are provided to be opposite to each other with the transport section 163 interposed therebetween. Transport mechanisms 141, 142 are provided in the transport section 163.

A placement buffer unit P-BF1 and a below-mentioned placement buffer unit P-BF2 (see FIG. 4) are provided between the transport section 163 and the transport section 132.

Further, a substrate platform PASS9 and below-mentioned placement cooling units P-CP (see FIG. 4) are provided to be adjacent to the carry-in carry-out block 14B between the transport mechanisms 141, 142.

A transport mechanism 146 is provided in the carry-in carry-out block 14B. The transport mechanism 146 carries in the substrate W to and carries out the substrate W from the exposure device 15. A substrate inlet 15a for carrying in the substrate W and a substrate outlet 15b for carrying out the substrate W are provided in the exposure device 15.

Figure 2:
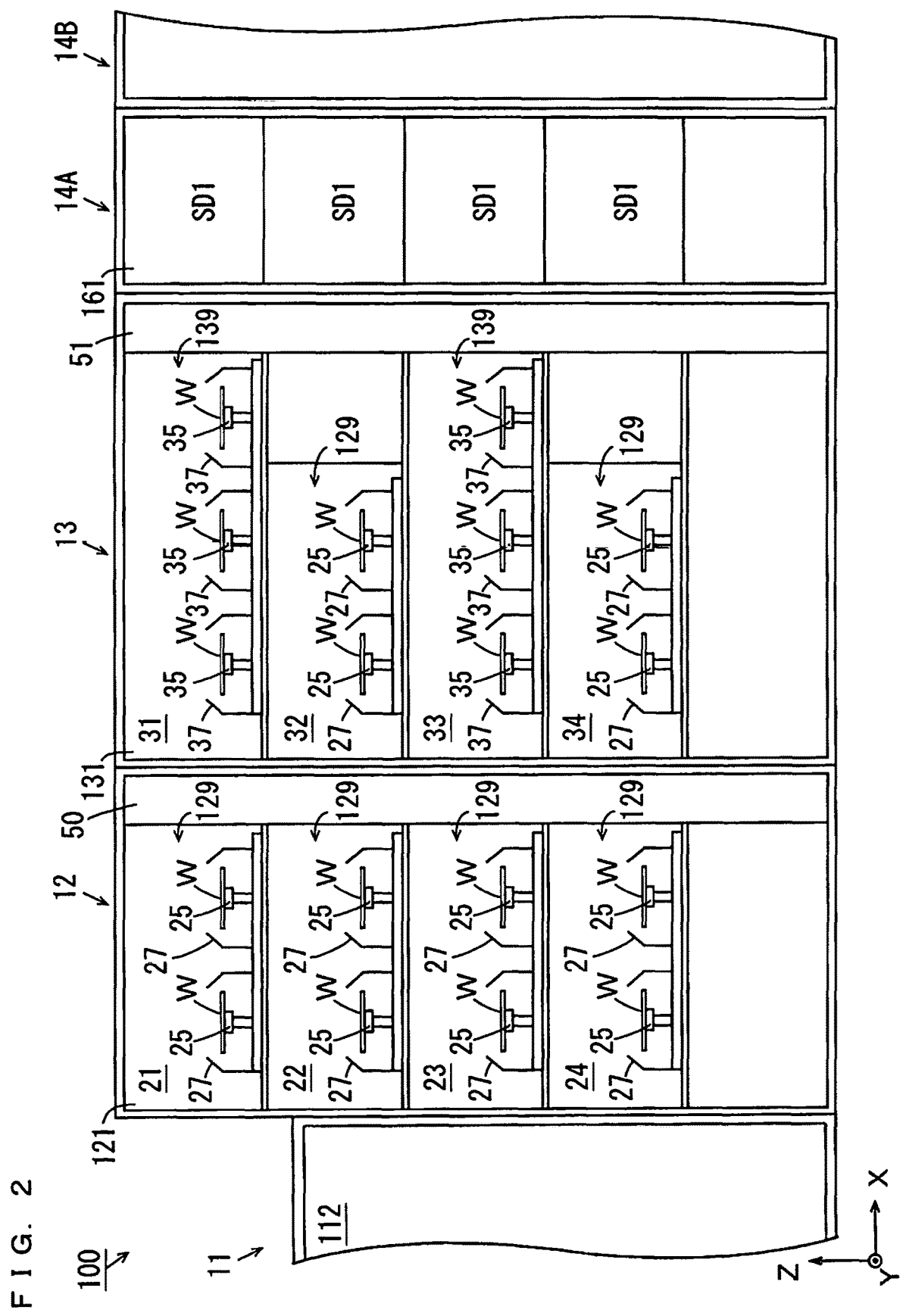
FIG. 2 is a schematic side view of the substrate processing apparatus mainly showing a coating processing section, a coating development processing section and a cleaning drying processing section of FIG. 1.

[2] Configurations of Coating Processing Section, Coating Development Processing Section and Cleaning Drying Processing Section FIG. 2 is a schematic side view of the substrate processing apparatus 100 mainly showing the coating processing section 121, the coating development processing section 131 and the cleaning drying processing section 161 of FIG. 1.

As shown in FIG. 2, the coating processing section 121 has coating processing chambers 21, 22, 23, 24 provided in a stack. Each of the coating processing chambers 21 to 24 is provided with a coating processing unit 129. The coating development processing section 131 has development processing chambers 31, 33 and coating processing chambers 32, 34 provided in a stack. Each of the development processing chambers 31, 33 is provided with a development processing unit 139, and each of the coating processing chambers 37, 34 is provided with the coating processing unit 129.

Each coating processing unit 129 includes spin chucks 25 that hold the substrates W and cups 27 provided to cover the surroundings of the spin chucks 25. In the present embodiment, each coating processing unit 129 is provided with two pairs of a spin chuck 25 and a cup 27. Each spin chuck 25 is driven to be rotated by a driving device (an electric motor, for example) that is not shown. Further, as shown in FIG. 1, each coating processing unit 129 includes a plurality of processing liquid nozzles 28 that discharge a processing liquid and a nozzle transport mechanism 29 that transports the processing liquid nozzles 28.

In the coating processing unit 129, each spin chuck 25 is rotated by a driving device (not shown), and any processing liquid nozzle 28 of the plurality of processing liquid nozzles 28 is moved to a position above the substrate W by the nozzle transport mechanism 29, and the processing liquid is discharged from the processing liquid nozzle 28. Thus, the processing liquid is applied onto the substrate W. Further, a rinse liquid is discharged to a peripheral portion of the substrate W from an edge rinse nozzle (not shown). Thus, the processing liquid adhering to the peripheral portion of the substrate W is removed.

In the coating processing unit 129 in each of the coating processing chambers 22, 24, a processing liquid for an anti-reflection film is supplied to the substrate W from the processing liquid nozzle 28. In the coating processing unit 129 in each of the coating processing chambers 21, 23, a processing liquid for a resist film is supplied to the substrate W from the processing liquid nozzle 28. In the coating processing unit 129 in each of the coating processing chambers 32, 34, a processing liquid for a resist cover film is supplied to the substrate W from the processing liquid nozzle 28.

Similarly to the coating processing unit 129, the development processing unit 139 includes spin chucks 35 and cups 37. Further, as shown in FIG. 1, the development processing unit 139 includes two development nozzles 38 that discharge a development liquid and a moving mechanism 39 that moves the development nozzles 38 in the X direction.

In the development processing unit 139, the spin chuck 35 is rotated by a driving device (not shown), and one development nozzle 38 supplies the development liquid to each substrate W while being moved in the X direction. Thereafter, the other development nozzle 38 supplies the development liquid to each substrate W while being moved in the X direction. In this case, the development processing is performed on the substrate W by the supply of the development liquid to the substrate W. Further, in the present embodiment, development liquids different from each other are discharged from the two development nozzles 38. Thus, two types of development liquids can be supplied to each substrate W.

In the cleaning drying processing section 161, a plurality (four in the present example) of cleaning drying processing units SD1 are provided. In the cleaning drying processing unit SD1, the substrate W that has not been exposed is cleaned and dried.

As shown in FIGS. 1 and 2, a fluid box 50 is provided in the coating processing section 121 to be adjacent to the coating development processing section 131. Similarly, a fluid box 51 is provided in the coating development processing section 131 to be adjacent to the cleaning drying processing block 14A. The fluid box 50 and the fluid box 51 each house fluid related elements such as a pipe, a joint, a valve, a flowmeter, a regulator, a pump, a temperature adjuster used to supply a chemical liquid to the coating processing units 129 and the development processing units 139 and discharge the chemical liquid, air and the like out of the coating processing units 129 and the development processing units 139.

Figure 3:
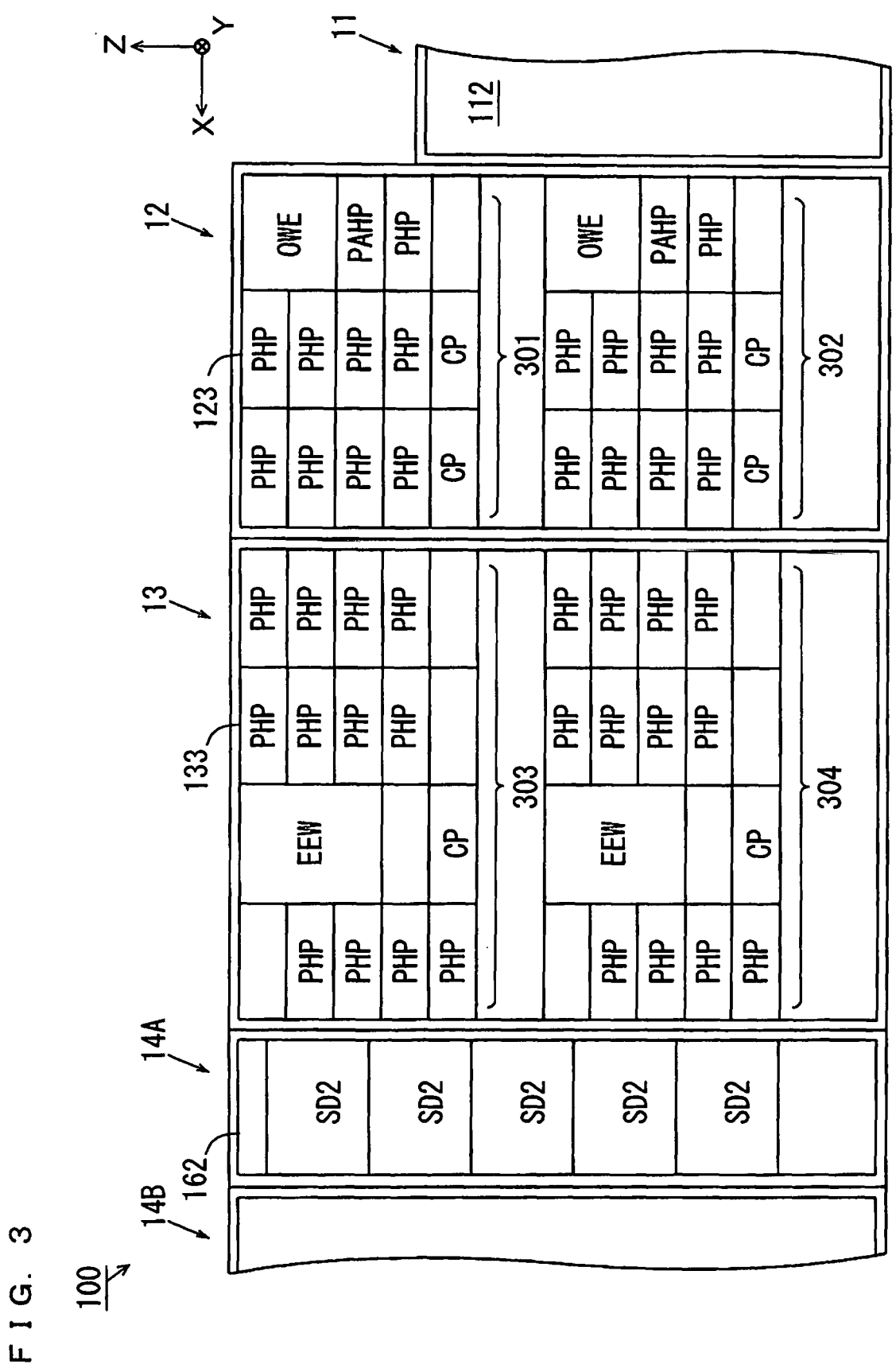
FIG. 3 is a schematic side view of the substrate processing apparatus mainly showing thermal processing sections and a cleaning drying processing section of FIG. 1.

[3] Configurations of Thermal Processing Sections and Cleaning Drying Processing Section FIG. 3 is a schematic side view of the substrate processing apparatus 100 mainly showing the thermal processing sections 123, 133 and the cleaning drying processing section 162 of FIG. 1. As shown in FIG. 3, the thermal processing section 123 has an upper thermal processing section 301 provided above and a lower thermal processing section 302 provided below. A neutralization device OWE, an adhesion reinforcement processing unit PAHP, a plurality of thermal processing units PHP and a plurality of cooling units CP are provided in each of the upper thermal processing section 301 and the lower thermal processing section 302.

In the neutralization device OWE, neutralization (removal of electric charge) processing is performed on the substrate W on which an anti-reflection film, a resist film or a resist cover film has not been formed. Details of the neutralization device OWE will be described below. In each adhesion reinforcement processing unit PAHP, adhesion reinforcement processing for improving adhesion between the substrate W and the anti-reflection film is performed. Specifically, in the adhesion reinforcement processing unit PAHP, an adhesion reinforcement agent such as HMDS (hexamethyldisilazane) is applied to the substrate W, and the heating processing is performed on the substrate W. In each thermal processing unit PHP, heating processing is performed on the substrate W. In each cooling unit CP, the cooling processing is performed on the substrate W.

The thermal processing section 133 has an upper thermal processing section 303 provided above and a lower thermal processing section 304 provided below. A cooling unit CP, a plurality of thermal processing units PHP and an edge exposure unit EEW are provided in each of the upper thermal processing section 303 and the lower thermal processing section 304.

In the edge exposure unit EEW, exposure processing (edge exposure processing) is performed on a region having a constant width at the peripheral portion of the resist film formed on the substrate W. In each of the upper thermal processing section 303 and the lower thermal processing section 304, each thermal processing unit PHP provided to be adjacent to the cleaning drying processing block 14A is configured to be capable of receiving the substrate W carried in from the cleaning drying processing block 14A.

In the cleaning drying processing section 162, a plurality (five in the present example) of cleaning drying processing units SD2 are provided. Each cleaning drying processing unit SD2 has the same configuration as the cleaning drying processing unit SD1. In the cleaning drying processing unit SD2, the substrate W that has been exposed is cleaned and dried.

[4] Configuration of Transport Sections

Figure 4:
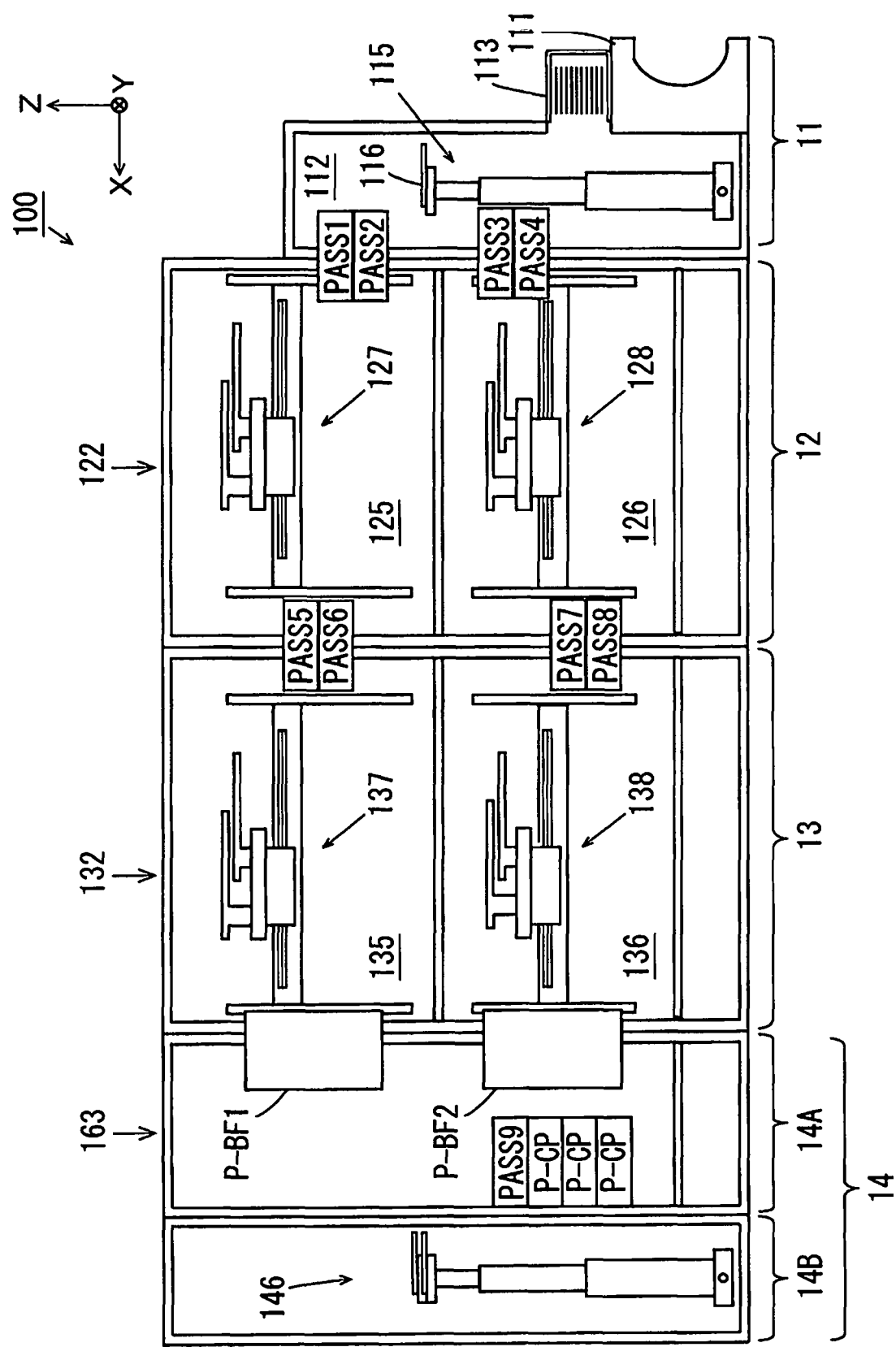
FIG. 4 is a side view mainly showing transport sections of FIG. 1.

FIG. 4 is a side view mainly showing the transport sections 122, 132, 163 of FIG. 1. As shown in FIG. 4, the transport section 122 has an upper transport chamber 125 and a lower transport chamber 126. The transport section 132 has an upper transport chamber 135 and a lower transport chamber 136. The upper transport chamber 125 is provided with the transport mechanism 127, and the lower transport chamber 126 is provided with the transport mechanism 128. Further, the upper transport chamber 135 is provided with the transport mechanism 137, and the lower transport chamber 136 is provided with the transport mechanism 138.

The substrate platforms PASS1, PASS2 are provided between the transport section 112 and the upper transport chamber 125, and the substrate platforms PASS3, PASS4 are provided between the transport section 112 and the lower transport chamber 126. The substrate platforms PASS5, PASS6 are provided between the upper transport chamber 125 and the upper transport chamber 135, and the substrate platforms PASS7, PASS8 are provided between the lower transport chamber 126 and the lower transport chamber 136.

The placement buffer unit P-BF1 is provided between the upper transport chamber 135 and the transport section 163, and the placement buffer unit P-BF2 is provided between the lower transport chamber 136 and the transport section 163. The substrate platform PASS9 and the plurality of placement cooling units P-CP are provided in the transport section 163 to be adjacent to the carry-in carry-out block 14B. In the placement cooling unit P-CP, the substrate W is cooled to a temperature suitable for the exposure processing.

The transport mechanism 127 is configured to be capable of transporting the substrates W among the substrate platforms PASS1, PASS2, PASS5, PASS6, the coating processing chambers 21, 22 (FIG. 2) and the upper thermal processing section 301 (FIG. 3). The transport mechanism 128 is configured to be capable of transporting the substrates W among the substrate platforms PASS3, PASS4, PASS7, PASS8, the coating processing chambers 23, 24 (FIG. 2) and the lower thermal processing section 302 (FIG. 3).

The transport mechanism 137 is configured to be capable of transporting the substrates W among the substrate platforms PASS5, PASS6, the placement buffer unit P-BF1, the development processing chamber 31 (FIG. 2), the coating processing chamber 32 (FIG. 2) and the upper thermal processing section 303 (FIG. 3). The transport mechanism 138 is configured to be capable of transporting the substrates W among the substrate platforms PASS7, PASS8, the placement buffer unit P-BF2, the development processing chamber 33 (FIG. 2), the coating processing chamber 34 (FIG. 2) and the lower thermal processing section 304 (FIG. 3).

The transport mechanism 141 (FIG. 1) of the transport section 163 is configured to be capable of transporting the substrates W among the placement cooling units P-CP, the substrate platform PASS9, the placement buffer units P-BF1, P-BF2 and the cleaning drying processing section 161 (FIG. 2).

The transport mechanism 142 (FIG. 1) of the transport section 163 is configured to be capable of transporting the substrates W among the placement cooling units P-CP, the substrate platform PASS9, the placement buffer units P-BF1, P-BF2, the cleaning drying processing section 162 (FIG. 3), the upper thermal processing section 303 (FIG. 3) and the lower thermal processing section 304 (FIG. 3).

[5] Operation of Substrate Processing Apparatus

The operation of the substrate processing apparatus 100 will be described with reference to FIGS. 1 to 4. The carriers 113 in which the unprocessed substrates W are stored are placed on the carrier platforms 111 (FIG. 1) in the indexer block 11. A film of SOG (Spin On Glass), SOC (Spin On Carbon) and the like is not formed on the unprocessed substrate W that is carried into the substrate processing apparatus 100 by the carrier 113. The transport mechanism 115 transports the unprocessed substrate W from the carrier 113 to the substrate platform PASS1, PASS3 (FIG. 4). Further, the transport mechanism 115 transports the processed substrate W that is placed on the substrate platform PASS2, PASS4 (FIG. 4) to the carrier 113.

In the first processing block 12, the transport mechanism 127 (FIG. 4) sequentially transports the substrate W placed on the substrate platform PASS1 to the neutralization device OWE (FIG. 3), the adhesion reinforcement processing unit PAHP (FIG. 3), the cooling unit CP (FIG. 3) and the coating processing chamber 22 (FIG. 2). Next, the transport mechanism 127 sequentially transports the substrate W on which an anti-reflection film is formed by the coating processing chamber 22 to the thermal processing unit PHP (FIG. 3), the cooling unit CP (FIG. 3) and the coating processing chamber 21 (FIG. 2). Then, the transport mechanism 127 sequentially transports the substrate W on which a resist film is formed by the coating processing chamber 21 to the thermal processing unit PHP (FIG. 3) and the substrate platform PASS5 (FIG. 4).

In this case, the neutralization processing is first performed on the substrate W in the neutralization device OWE. Thereafter, the adhesion reinforcement processing is performed on the substrate W in the adhesion reinforcement processing unit PAHP, and then the substrate W is cooled in the cooling unit CP to a temperature suitable for formation of an anti-reflection film. Next, an anti-reflection film is formed on the substrate W by the coating processing unit 129 (FIG. 2) in the coating processing chamber 22. Subsequently, the thermal processing is performed on the substrate W in the thermal processing unit PHP, and then the substrate W is cooled in the cooling unit CP to a temperature suitable for the formation of a resist film. Next, in the coating processing chamber 21, a resist film is formed on the substrate W by the coating processing unit 129 (FIG. 2). Thereafter, the thermal processing is performed on the substrate W in the thermal processing unit PHP, and the substrate W is placed on the substrate platform PASS5.

Further, the transport mechanism 127 transports the substrate W on which the development processing has been performed and which is placed on the substrate platform PASS6 (FIG. 4) to the substrate platform PASS2 (FIG. 4).

The transport mechanism 128 (FIG. 4) sequentially transports the substrate W placed on the substrate platform PASS3 to the neutralization device OWE (FIG. 3), the adhesion reinforcement processing unit PAHP (FIG. 3), the cooling unit CP (FIG. 3) and the coating processing chamber 24 (FIG. 2). Then, the transport mechanism 128 sequentially transports the substrate W on which an anti-reflection film is formed by the coating processing chamber 24 to the thermal processing unit PHP (FIG. 3), the cooling unit CP (FIG. 3) and the coating processing chamber 23 (FIG. 2). Subsequently, the transport mechanism 128 sequentially transports the substrate W on which a resist film is formed by the coating processing chamber 23 to the thermal processing unit PHP (FIG. 3) and the substrate platform PASS7 (FIG. 4).

Further, the transport mechanism 128 (FIG. 4) transports the substrate W on which the development processing has been performed and which is placed on the substrate platform PASS8 (FIG. 4) to the substrate platform PASS4 (FIG. 4). The processing contents for the substrate W in each of the coating processing chambers 23, 24 (FIG. 2) and the lower thermal processing section 302 (FIG. 3) are similar to the processing contents for the substrate W in each of the above-mentioned coating processing chambers 21, 22 (FIG. 2) and upper thermal processing section 301 (FIG. 3).

In the second processing block 13, the transport mechanism 137 (FIG. 4) sequentially transports the substrate W on which a resist film is formed and which is placed on the substrate platform PASS5 to the coating processing chamber 32 (FIG. 2), the thermal processing unit PHP (FIG. 3), the edge exposure unit EEW (FIG. 3) and the placement buffer unit P-BF1 (FIG. 4). In this case, in the coating processing chamber 32, a resist cover film is formed on the substrate W by the coating processing unit 129 (FIG. 2). Thereafter, the thermal processing is performed on the substrate W in the thermal processing unit PHP, and the substrate W is carried into the edge exposure unit EEW. Subsequently, in the edge exposure unit EEW, the edge exposure processing is performed on the substrate W. The substrate W on which the edge exposure processing has been performed is placed on the placement buffer unit P-BF1.

Further, the transport mechanism 137 (FIG. 4) takes out the substrate Won which the exposure processing has been performed by the exposure device 15 and the thermal processing has been performed from the thermal processing unit PHP (FIG. 3) that is adjacent to the cleaning drying processing block 14A. The transport mechanism 137 sequentially transports the substrate W to the cooling unit CP (FIG. 3), the development processing chamber 31 (FIG. 2), the thermal processing unit PHP (FIG. 3) and the substrate platform PASS6 (FIG. 4).

In this case, after the substrate W is cooled to a temperature suitable for the development processing in the cooling unit CP, the resist cover film is removed, and the development processing is performed on the substrate W by the development processing unit 139 in the development processing chamber 31. Thereafter, the thermal processing is performed on the substrate W in the thermal processing unit PHP, and the substrate W is placed on the substrate platform PASS6.

The transport mechanism 138 (FIG. 4) sequentially transports the substrate W on which a resist film is formed and which is placed on the substrate platform PASS7 to the coating processing chamber 34 (FIG. 2), the thermal processing unit PHP (FIG. 3), the edge exposure unit EEW (FIG. 3) and the placement buffer unit P-BF2 (FIG. 4).

Further, the transport mechanism 138 (FIG. 4) takes out the substrate W that has been exposed by the exposure device 15 and thermally processed from the thermal processing unit PHP (FIG. 3) that is adjacent to the cleaning drying processing block 14A. The transport mechanism 138 sequentially transports the substrate W to the cooling unit CP (FIG. 3), the development processing chamber 33 (FIG. 2), the thermal processing unit PHP (FIG. 3) and the substrate platform PASS8 (FIG. 4). The processing contents for the substrate W in the development processing chamber 33, the coating processing chamber 34 and the lower thermal processing section 304 are similar to the processing contents for the substrate W in the development processing chamber 31, the coating processing chamber 32 (FIG. 2) and the upper thermal processing section 303 (FIG. 3), described above.

In the cleaning drying processing block 14A, the transport mechanism 141 (FIG. 1) transports the substrate W that is placed on the placement buffer unit P-BF1, P-BF2 (FIG. 4) to the cleaning drying processing unit SD1 (FIG. 2) in the cleaning drying processing section 161. Then, the transport mechanism 141 transports the substrate W from the cleaning drying processing unit SD1 to the placement cooling unit P-CP (FIG. 4). In this case, after the substrate W is cleaned and dried in the cleaning drying processing unit SD1, the substrate W is cooled in the placement cooling unit P-CP to a temperature suitable for the exposure processing in the exposure device 15 (FIG. 1).

The transport mechanism 142 (FIG. 1) transports the substrate W that has been exposed and is placed on the substrate platform PASS9 (FIG. 4) to the cleaning drying processing unit SD2 (FIG. 3) in the cleaning drying processing section 162. Further, the transport mechanism 142 transports the substrate W that has been cleaned and dried to the thermal processing unit PHP (FIG. 3) in the upper thermal processing section 303 or the thermal processing unit PHP (FIG. 3) in the lower thermal processing section 304 from the cleaning drying processing unit SD2. In this thermal processing unit PHP, post-exposure bake (PEB) processing is performed.

In the carry-in carry-out block 14B, the transport mechanism 146 (FIG. 1) transports the substrate W that has not been exposed and is placed on the placement cooling unit P-CP (FIG. 4) to the substrate inlet 15a (FIG. 1) of the exposure device 15. Further, the transport mechanism 146 (FIG. 1) takes out the exposed substrate W from the substrate outlet 15b (FIG. 1) of the exposure device 15, and transports the substrate W to the substrate platform PASS9 (FIG. 4).

When the exposure device 15 cannot receive the substrate W, the substrate W that has not been exposed is temporarily stored in the placement buffer unit P-BF1, P-BF2. Further, when the development processing unit 139 (FIG. 2) in the second processing block 13 cannot receive the exposed substrate W, the exposed substrate W is temporarily stored in the placement buffer unit P-BF1, P-BF2.

In the present embodiment, processing for the substrates W in the coating processing chambers 21, 22, 32, the development processing chamber 31 and the upper thermal processing sections 301, 303 that are provided above, and the processing for the substrates W in the coating processing chambers 23, 24, 34, the development processing chamber 33 and the lower thermal processing sections 302, 304 that are provided below can be concurrently performed. Thus, it is possible to improve the throughput without increasing the footprint.

[6] Neutralization Device

First, an outline of the neutralization processing performed by the neutralization device OWE according to the present embodiment will be described. In the neutralization device OWE, an upper surface (a main surface) of the substrate W arranged in an atmosphere including oxygen molecules is irradiated with vacuum ultraviolet rays having a wavelength of about not less than 120 nm and about not more than 230 nm. At this time, part of the vacuum ultraviolet rays with which the substrate W is irradiated is absorbed by the atmosphere including oxygen molecules. The atmosphere above the upper surface of the substrate W absorbs part of the vacuum ultraviolet rays, whereby each oxygen molecule included in the atmosphere is decomposed into two oxygen atoms by photodissociation. The oxygen atom generated by decomposition is coupled with an oxygen molecule present in the surroundings, so that ozone is generated.

Ozone is a resonance hybrid expressed by superposition of a resonance structure with a positive electrical charge and a resonance structure with a negative electrical charge. Each resonance structure includes a covalent bond and a coordinate bond. Because the coordinate bond is unstable, when the generated ozone comes into contact with the upper surface of the electro-positive substrate W or the electro-negative substrate W, electrical charge is given and received between the ozone and the substrate W. In this case, the coordinate bond of the ozone is broken, and an electrical potential of the substrate W becomes close to 0 (V). In this manner, the substrate W is neutralized such that the electrical potential becomes close to 0 (V) regardless of an amount of electrical charge and polarity of electrification of the substrate W.

Figure 5:
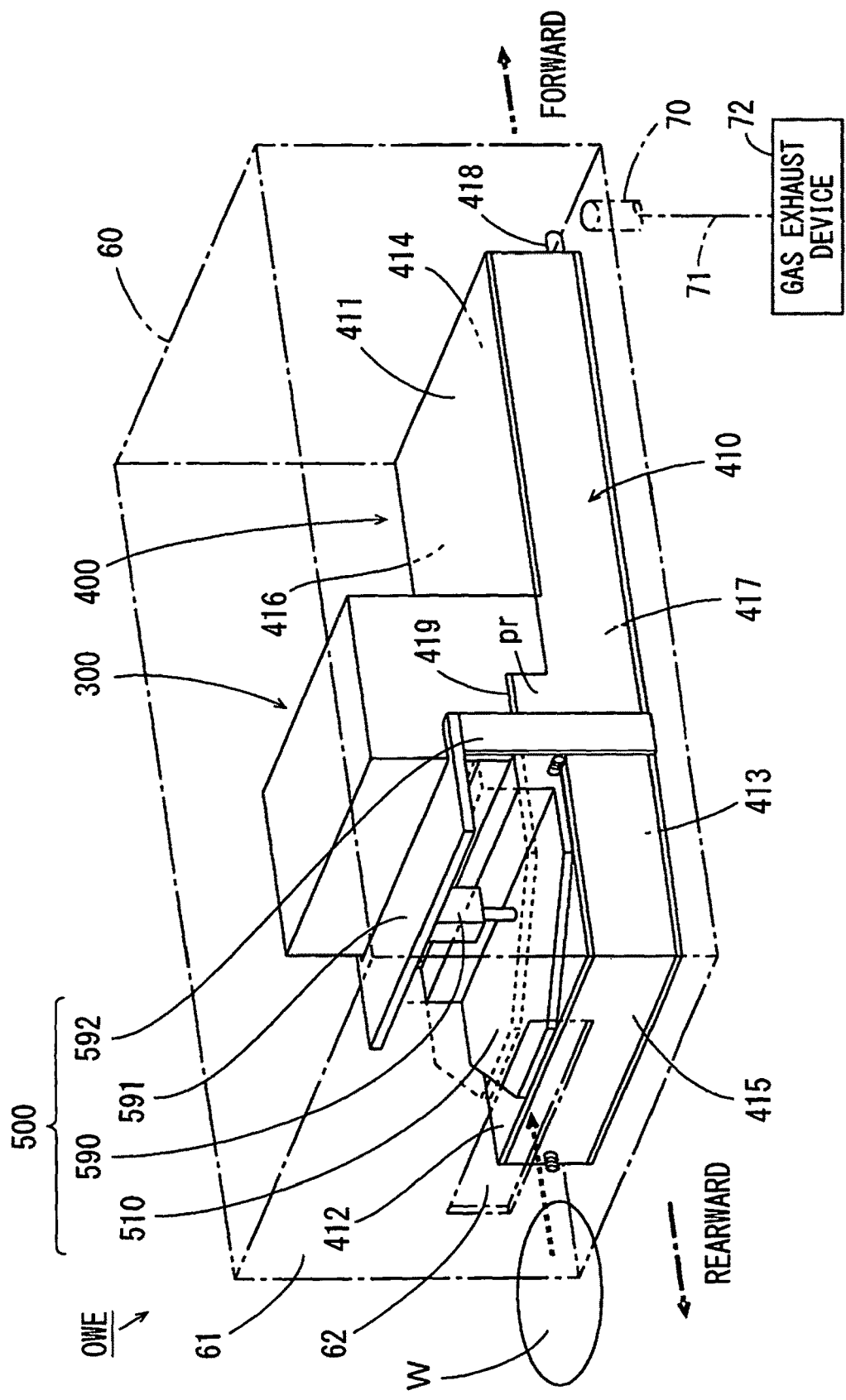
FIG. 5 is an external perspective view of a neutralization device.
Figure 6:
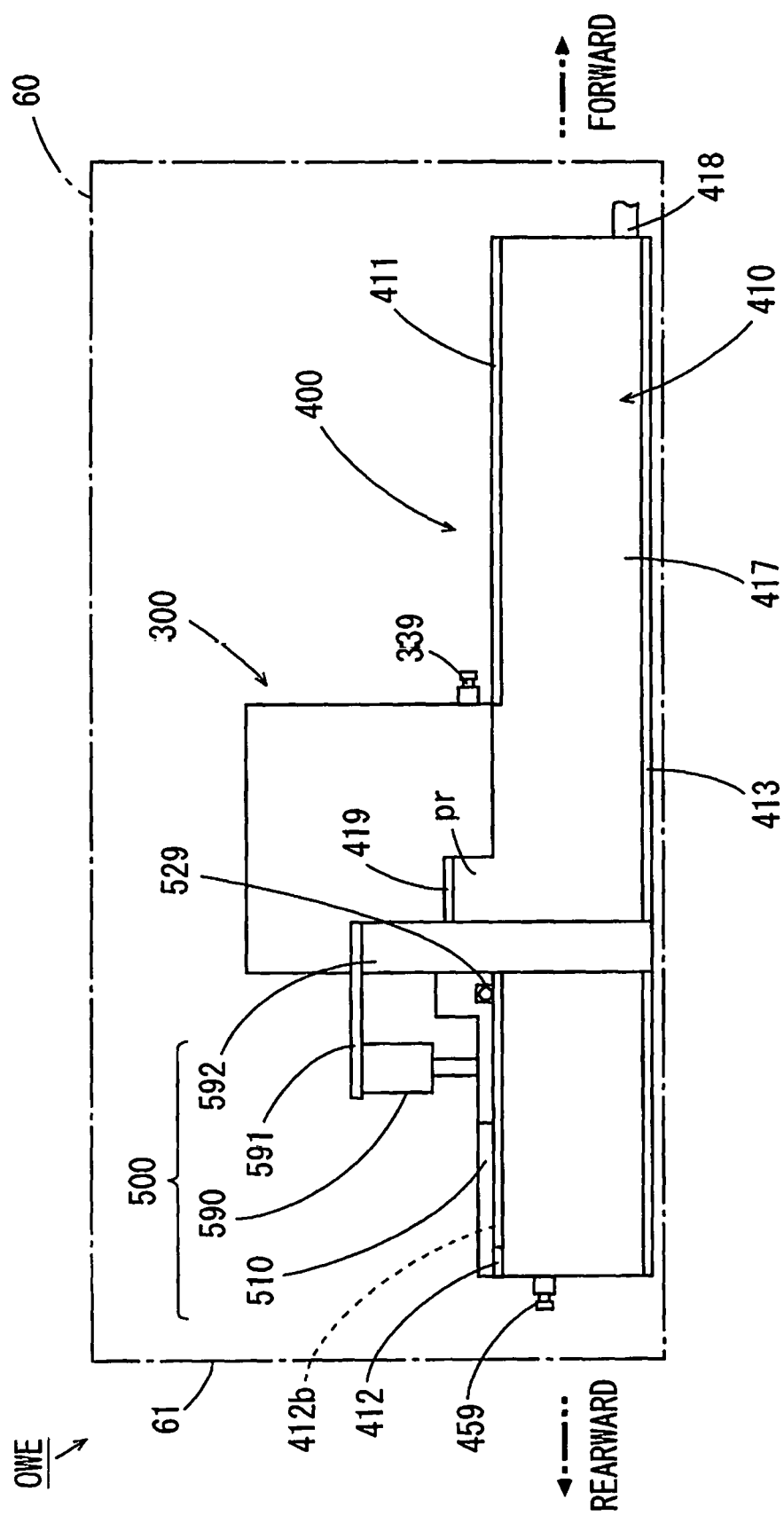
FIG. 6 is a side view of the neutralization device.

Next, details of a configuration of the neutralization device OWE will be described. FIG. 5 is an external perspective view of the neutralization device OWE, and FIG. 6 is a side view of the neutralization device OWE. As indicated by one-dot and dash lines in FIGS. 5 and 6, the neutralization device OWE includes a box 60. The box 60 has an outer wall facing the transport section 122 of FIG. 1. As shown in FIG. 5, a transport opening 62 through which the substrate W is transported between the transport section 122 and the box 60 is formed in the outer wall 61. Further, a gas exhaust port 70 is provided in a bottom portion of the box 60. The gas exhaust port 70 is connected to a gas exhaust device 72 through a pipe 71. The gas exhaust device 72 is gas exhaust equipment in a factory, for example, and performs detoxification of the gas exhausted from the box 60, and the like.

In the following description, as indicated by thick one-dot and dash arrows in each of FIG. 5 and subsequent given diagrams, a direction directed from the inside of the box 60 towards the transport opening 62 is referred to as rearward, and its opposite direction is referred to as forward.

The neutralization device OWE is mainly constituted by a light emitter 300, a substrate mover 400 and a carry-in carry-out mechanism 500 in addition to the box 60. The substrate mover 400 includes a casing 410 having a substantially cuboid shape. The casing 410 includes a front upper surface portion 411, a central upper surface portion 419, a rear upper surface portion 412, a lower surface portion 413, a front surface portion 414, a rear surface portion 415, one side surface portion 416 and the other side surface portion 417.

The one side surface portion 416 and the other side surface portion 417 are provided to extend in a front-and-rear direction and be opposite to each other. A projection pr projecting upward by a constant height is formed at the center of the upper end of each of the one side surface portion 416 and the other side surface portion 417. In each of FIGS. 5 and 6, only the projection pr of the other side surface portion 417 out of the projections pr of the one side surface portion 416 and the other side surface portion 417 is shown.

The central upper surface portion 419 is provided to connect the projection pr of the one side surface portion 416 to the projection pr of the other side surface portion 417. The front upper surface portion 411 is provided to connect the upper end of the one side surface portion 416 to the upper end of the other side surface portion 417 at a position farther forward than the projections pr. The rear upper surface portion 412 is provided to connect the upper end of the one side surface portion 416 to the upper end of the other side surface portion 417 at a position farther rearward than the projections pr. The height of the front upper surface portion 411 and the height of the rear upper surface portion 412 are equal to each other.

The light emitter 300 is provided on the casing 410 to connect the upper end of the one side surface portion 416 to the upper end of the other side surface portion 417 and be located between the front upper surface portion 411 and the rear upper surface portion 412. Part of the light emitter 300 is located above the central upper surface portion 419. Details of the light emitter 300 will be described below.

The carry-in carry-out mechanism 500 is provided behind the light emitter 300. As shown in FIG. 6, the carry-in carry-out mechanism 500 includes a cover member 510, a cover driver 590, a support plate 591 and two support shafts 592. In FIG. 6, only one support shaft 592 of the two support shafts 592 is shown. The two support shafts 592 are respectively provided to extend in an up-and-down direction on both sides of the casing 410. The support plate 591 is supported in a horizontal attitude by the two support shafts 592. In this state, the support plate 591 is located behind the light emitter 300 and above the rear upper surface portion 412. The cover driver 590 is attached to the lower surface of the support plate 591. The cover member 510 is provided below the cover driver 590.

An opening 412b is formed in the rear upper surface portion 412 of the casing 410. The cover driver 590 moves the cover member 510 in the up-and-down direction by driving the cover member 510. Thus, the opening 412b is closed or opened. The opening 412b is opened, so that the substrate W can be carried into the casing 410 and the substrate W ran be carried out from the casing 410. Details of the structure of the cover member 510 and an opening closing operation of the opening 412b performed by the cover member 510 will be described below.

Figure 7:
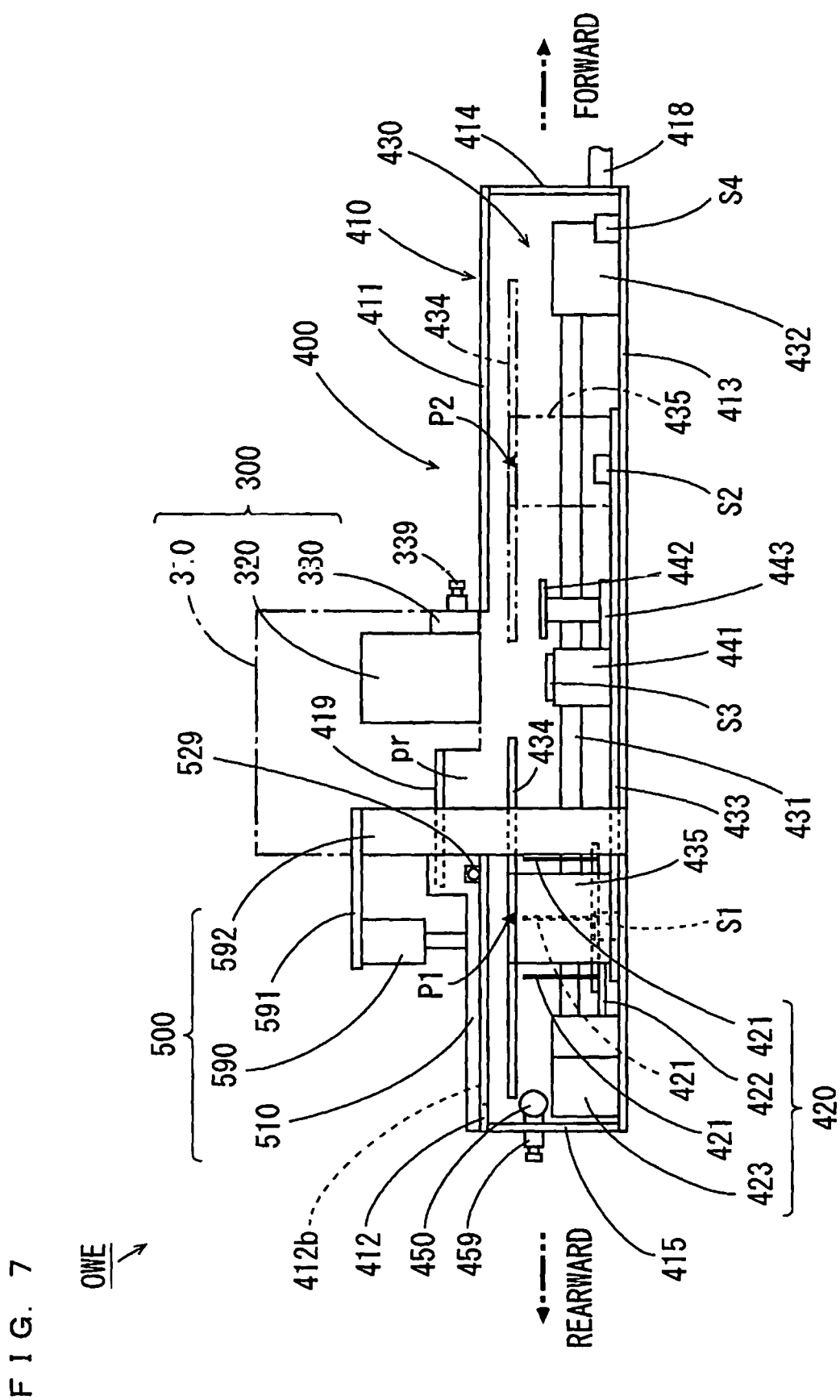
FIG. 7 is a side view for explaining an inner configuration of the neutralization device.
Figure 8:
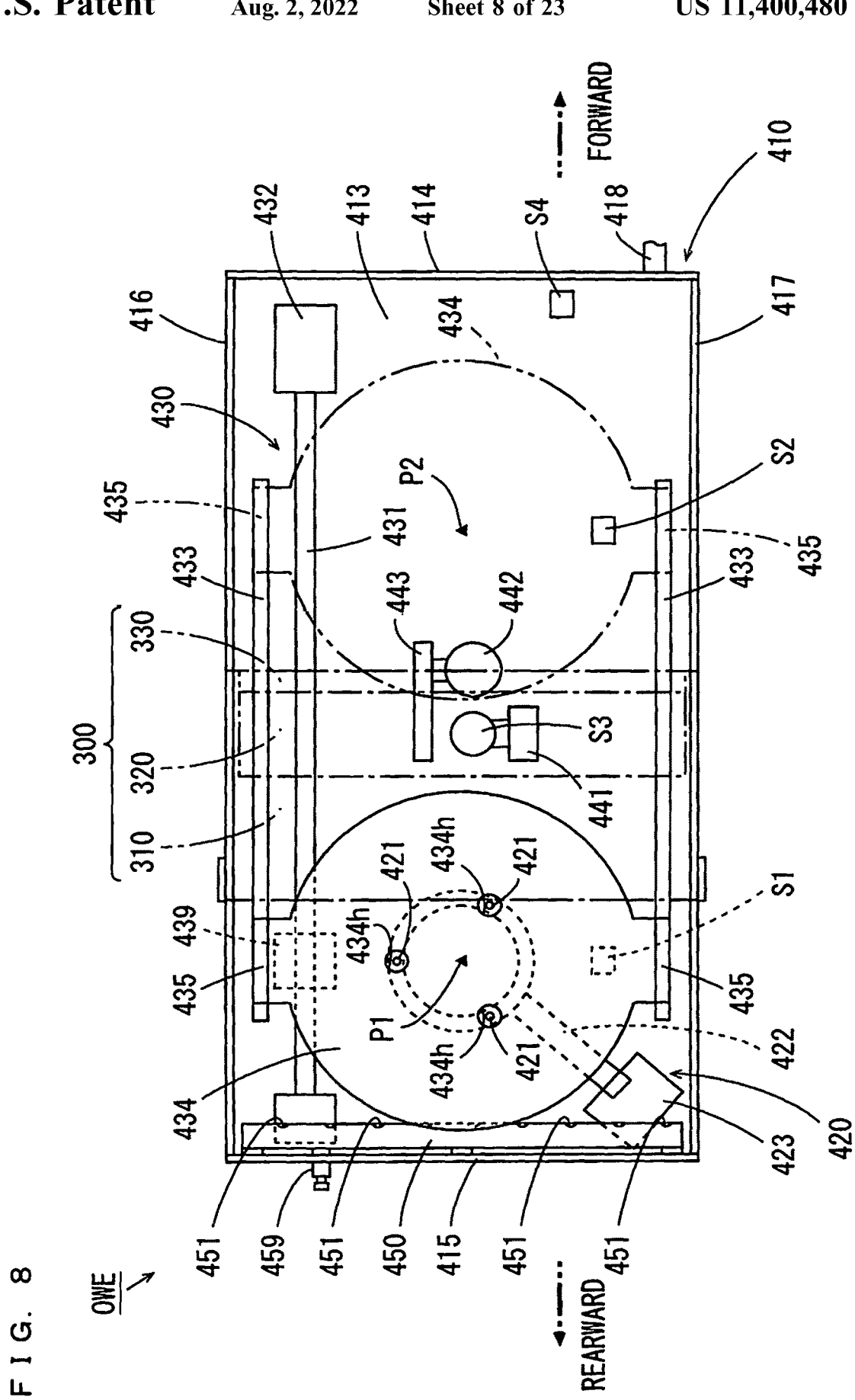
FIG. 8 is a plan view for explaining the inner configuration of the neutralization device.
Figure 9:
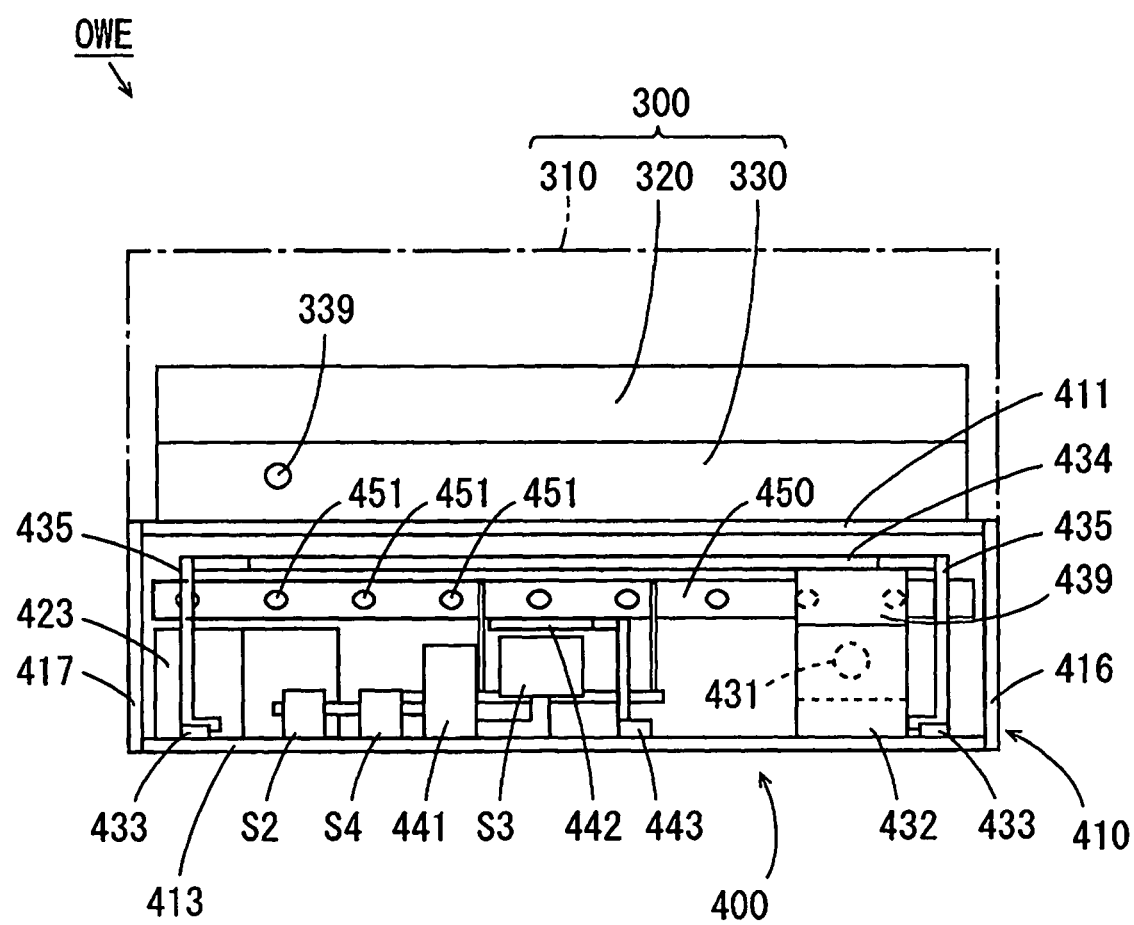
FIG. 9 is a front view for explaining the inner configuration of the neutralization device.

FIG. 7 is a side view for explaining internal structure of the neutralization device OWE, FIG. 8 is a plan view for explaining the internal structure of the neutralization device OWE, and FIG. 9 is a front view for explaining the internal structure of the neutralization device OWE.

In FIG. 7, a state of the neutralization device OWE from which the other side surface portion 417 (FIG. 5) is detached is shown. In FIG. 8, a state of the neutralization device OWE from which the front upper surface portion 411 (FIG. 5) and the rear upper surface portion 412 (FIG. 5) are detached is shown. In FIG. 9, a state of the neutralization device OWE from which the front surface portion 414 (FIG. 5) is detached is shown. Further, in each of FIGS. 7 to 9, part or all of the structure of the light emitter 300 (FIG. 5) is indicated by a one-dot and dash line, and the box 60 (FIG. 5) is not shown.

As shown in FIG. 7, a receiving transferring mechanism 420 and a local transport mechanism 430 are provided in the casing 410 of the substrate mover 400. The receiving transferring mechanism 420 includes a plurality of lifting lowering pins 421, a pin support member 422 and a pin lifting lowering driver 423, and is arranged at a position farther rearward than the light emitter 300.

The plurality of lifting lowering pins 421 are attached to the pin support member 422 to respectively extend upward. The pin lifting lowering driver 423 supports the pin support member 422 to be movable in the up-and-down direction. In this state, the plurality of lifting lowering pins 421 are arranged to overlap with the opening 412b of the rear upper surface portion 412. The receiving transferring mechanism 420 is controlled by the controller 114 of FIG. 1, for example. The pin lifting lowering driver 423 is operated, so that upper ends of the plurality of the lifting lowering pins 421 are moved between receiving transferring positions farther upward than the rear upper surface portion 412 and waiting positions farther downward than a below-mentioned local transport hand 434.

As shown in FIG. 8, the local transport mechanism 430 includes a feed shaft 431, a feed shaft motor 432, two guide rails 433, the local transport hand 434, two hand support members 435 and a coupling member 439.

In the casing 410, the feed shaft motor 432 is provided in the vicinity of the front surface portion 414. The feed shaft 431 is provided to extend in the front-and-rear direction from the feed shaft motor 432 to a position in the vicinity of the rear surface portion 415. The feed shaft 431 is a ball screw, for example, and is connected to a rotation shaft of the feed shaft motor 432.

One guide rail 433 is provided to extend in the front-and-rear direction in the vicinity of the one side surface portion 416. Further, the other guide rail 433 is provided to extend in the front-and-rear direction in the vicinity of the other side surface portion 417. The feed shaft 431 and the two guide rails 433 are arranged to be parallel to each other.

The two hand support members 435 are respectively provided on the two guide rails 433 to be movable in the front-and-rear direction and extend upward. The two hand support members 435 have the common height. The local transport hand 434 is provided to connect the upper ends of the two hand support members 435. The local transport hands 434 is a plate member having a substantially circular shape, and is supported by the two hand support members 435. The substrate W is placed on the local transport hand 434.

A plurality of through holes 434h are formed in each of the local transport hands 434. The plurality of through holes 434h are arranged at equal angular intervals to surround the center of the local transport hand 434. The plurality of lifting lowering pins 421 of the receiving transferring mechanism 420 can be respectively inserted into the plurality of through holes 434h. Further, the coupling member 439 that couples the local transport hand 434 to the feed shaft 431 is provided at the lower surface of the local transport hand 434.

The local transport mechanism 430 is controlled by the controller 114 of FIG. 1, for example. The feed shaft motor 432 is operated, so that the feed shaft 431 is rotated. Thus, the local transport hand 434 moves in the front-and-rear direction between a rear position P1 farther rearward than the light emitter 300 and a front position P2 farther forward than the light emitter 300. In each of FIG. 7 and subsequent given diagrams, the center of the local transport hand 434 located at the rear position P1 and the center of the local transport hand 434 located at the front position P2 are indicated by black triangles. In each of FIG. 7 and FIG. 8, the local transport hand 434 being located at the front position P2 and the hand support members 435 are indicated by two-dots and dash lines.

With the upper ends of the plurality of lifting lowering pins 421 of the receiving transferring mechanism 420 being located at the waiting positions and the local transport hand 434 being located at the rear position P1, the plurality of through holes 434h are respectively positioned above the plurality of lifting lowering pins 421 of the receiving transferring mechanism 420.

During the neutralization processing of the substrate W, ozone is generated due to photodissociation of oxygen molecules in the casing 410. Since ozone has harmful effects on human body, excessive generation of ozone is not preferable. The higher the oxygen concentration in the casing 410 is, the larger an amount of ozone generated in the casing 410 is. The lower the oxygen concentration in the casing 410 is, the smaller an amount of ozone generated in the casing 410 is. As such, a first nitrogen gas supplier 450 is provided in the casing 410 in order to lower the oxygen concentration in the casing 410. As shown in FIG. 8, the first nitrogen gas supplier 450 is constituted by a pipe-like member with both ends closed and attached to an inner surface of the rear surface portion 415 to extend from the one side surface portion 416 to the other side surface portion 417.

As shown in rig. 9, a plurality of injection holes 451 are formed in portions directed forward of the first nitrogen gas supplier 450. The plurality of injection holes 451 are arranged at substantially equal intervals from the one end to the other end of the first nitrogen gas supplier 450. Further, as shown in FIG. 7 and FIG. 8, one end of a nitrogen gas inlet pipe 459 is connected to a portion directed rearward of the first nitrogen gas supplier 450. The other end of the nitrogen gas inlet pipe 459 is located outside of the casing 410.

A nitrogen gas supply system (not shown) is connected to the other end of the nitrogen gas inlet pipe 459. A gas outlet pipe 418 for discharging an atmosphere in the casing 410 to the outside of the casing 410 is provided at the front surface portion 414 of the casing 410. A nitrogen gas supplied from the nitrogen gas supply system to the nitrogen gas inlet pipe 459 is injected into the casing 410 from the plurality of injection holes 451 through an inner space of the first nitrogen gas supplier 450. At this time, the atmosphere in the casing 410 is exhausted from the gas outlet pipe 418 to the outside of the casing 410. Thus, the atmosphere in the casing 410 is replaced by a nitrogen gas, and the oxygen concentration is lowered. Therefore, excessive generation of ozone is suppressed. As a result, an amount of ozone leaked to the outside of the casing 410 is reduced.

Further, a nitrogen gas supplied into the casing 410 functions as a catalyst of three-body reaction of an oxygen atom and an oxygen molecule during generation of ozone in the neutralization processing. Therefore, an appropriate amount of ozone is efficiently generated.

Here, as shown in FIG. 5, in the box 60, the ozone exhausted from the gas outlet pipe 418 to the outside of the casing 410 is sent to the gas exhaust device 72 through the gas exhaust port 70 and the pipe 71. Therefore, the ozone generated by the neutralization processing is prevented from spreading to the surroundings of the neutralization device OWE.

As shown in FIG. 7, a rear position sensor S1, a front position sensor S2, an irradiance sensor S3 and an oxygen concentration sensor S4 are further provided in the casing 410. The rear position sensor S1 detects whether the local transport hand 434 is located at the rear position P1, and supplies a result of detection to the controller 114 of FIG. 1. The front position sensor S2 detects whether the local transport hand 434 is located at the front position P2, and supplies a result of detection to the controller 114 of FIG. 1. As the rear position sensor S1 and the front position sensor S2, an optical sensor, for example, is used.

The oxygen concentration sensor S4 detects the oxygen concentration in the casing 410, and supplies a result of detection to the controller 114 of FIG. 1. As the oxygen concentration sensor S4, a galvanic cell type oxygen sensor, a zirconia oxygen sensor or the like is used.

The irradiance sensor S3 includes a light receiving element such as a photo diode, and detects irradiance of light with which a light receiving surface of the light receiving element is irradiated. Here, the irradiance is a work rate of light with which a unit area of the light receiving surface is irradiated. A unit of irradiance is represented by "$W/m^2$", for example. In the present embodiment, the irradiance detected by the irradiance sensor S3 is equivalent to irradiance of the vacuum ultraviolet rays with which the substrate W that is moved between the rear position P1 and the front position P2 by the local transport hand 434 is irradiated, that is, irradiance of the vacuum ultraviolet rays with which the substrate W is irradiated during the neutralization processing. Further, the irradiance sensor S3 is supported at a position opposite to a below-mentioned emission surface 321 (FIG. 13C) of the light emitter 300 to be movable in the up-and-down direction by a sensor lifting lowering driver 441. The sensor lifting lowering driver 441 is controlled by the controller 114 of FIG. 1, for example.

As shown in FIG. 8 and FIG. 9, a light blocking member 442 and a light blocking driver 443 are provided in the vicinity of the irradiance sensor S3. The light blocking member 442 has an outer shape larger than the light receiving element of the irradiance sensor S3. The light blocking driver 443 supports the light blocking member 442 at a position (height) between the irradiance sensor S3 and the light emitter 300 in the up-and-down direction to be movable in the front-and-rear direction. The light blocking driver 443 is controlled by the controller 114 of FIG. 1, for example. Details of operations of the sensor lifting lowering driver 441 and the light blocking driver 443 will be described below.

Figure 10:
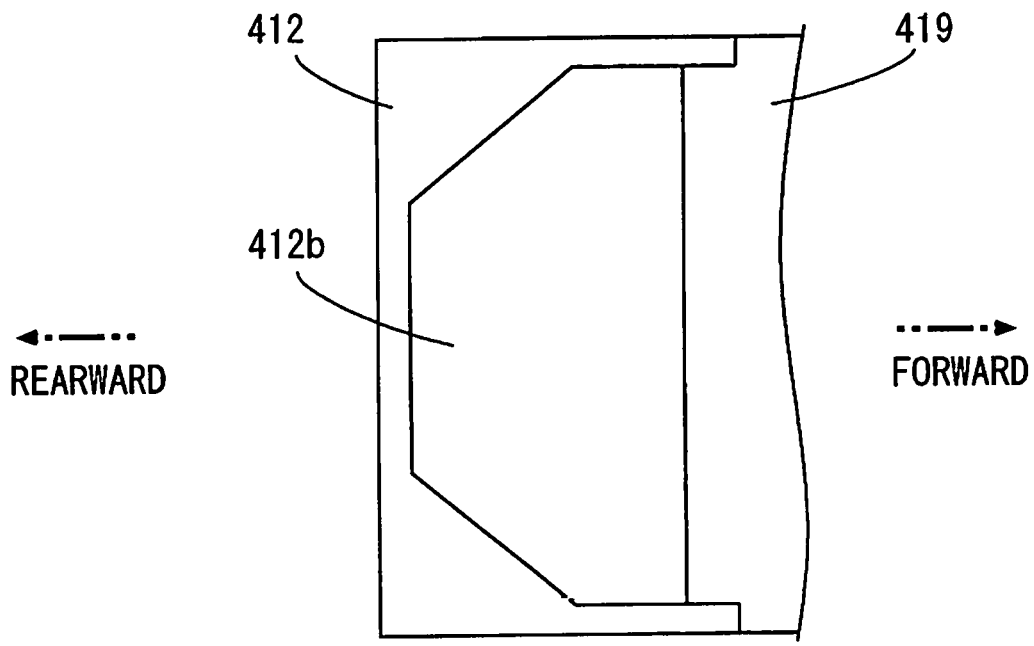
FIG. 10 is a plan view of a rear upper surface portion and a central upper surface portion.

Next, configurations of the rear upper surface portion 412 and the central upper surface portion 419 of the casing 410, and a configuration of the cover member 510 of the carry-in carry-out mechanism 500 will be described. FIG. 10 is a plan view of the rear upper surface portion 412 and the central upper surface portion 419, and FIG. 11 is a bottom view of the cover member 510.

As shown in FIG. 10, when the rear upper surface portion 412 and the central upper surface portion 419 are viewed from above, the opening 412b is surrounded by a rear edge of the rear upper surface portion 412 and a front edge of the central upper surface portion 419. The cover member 510 has an outer shape slightly larger than the opening 412b. Further, the lower surface of the cover member 510 is formed such that a region 510d, excluding the both ends, having a constant width from part of the front edge is higher than the other region by a constant height.

When the opening 412b is closed by the cover member 510, a region 510c, having a constant width from the outer edge and excluding the front edge, of the lower surface of the cover member 510 abuts against the upper surface of the rear upper surface portion 412. Further, the region 510d of the lower surface of the cover member 510 abuts against the upper surface of the central upper surface portion 419. That is, the lower surface of the cover member 510 comes into contact with a region surrounding the opening 412b of the rear upper surface portion 412 and the central upper surface portion 419. Thus, a gap is not generated between the casing 410 and the cover member 510. Therefore, a hermetic state in the casing 410 is improved with a simple configuration.

Figure 11:
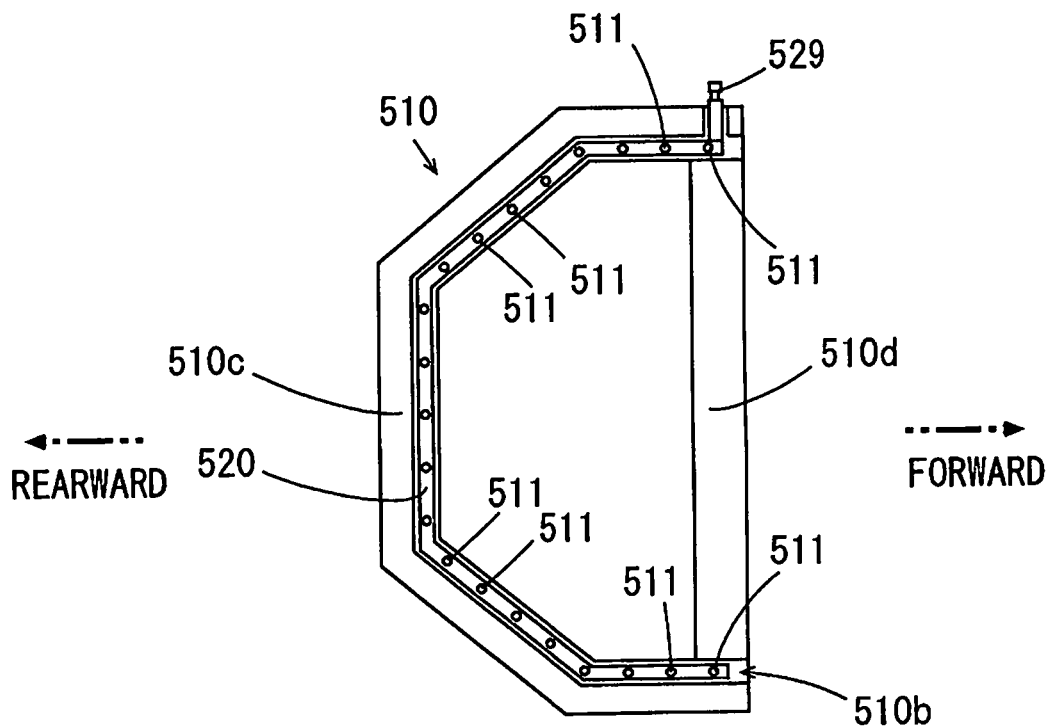
FIG. 11 is a bottom view of a cover member.

As shown in FIG. 11, a groove 510b having a substantially constant width is formed at the lower surface of the cover member 510 to extend along an inner edge of the region 510c. A second nitrogen gas supplier 520 is provided in the groove 510b. The second nitrogen gas supplier 520 is constituted by a pipe member with its one end closed. A plurality of injection holes 511 are formed in portions directed downward of the second nitrogen gas supplier 20. The plurality of injection holes 511 are arranged at substantially equal intervals. Further, one end of a nitrogen gas inlet pipe 529 is connected to the other end of the second nitrogen gas supplier 520. The other end of the nitrogen gas inlet pipe 529 projects sideward of the cover member 510. A nitrogen gas supply system (not shown) is connected to the other end of the nitrogen gas inlet pipe 529.

Figure 12:
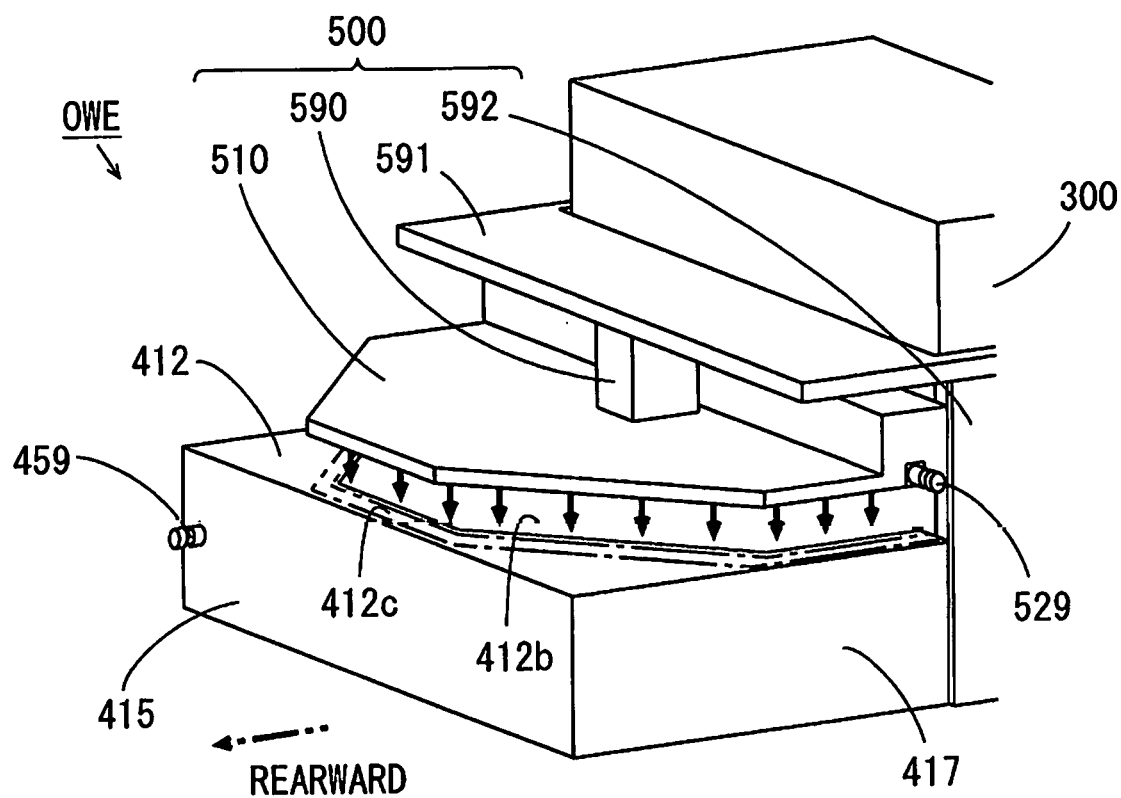
FIG. 12 is an external perspective view of the neutralization device showing an opened opening of a casing.

FIG. 12 is an external perspective view of the neutralization device OWE showing the opened opening 412b of the casing 410. In FIG. 12, only the carry-in carry-out mechanism 500 and its peripheries of the neutralization device OWE are shown.

When the opening 412b is opened by the cover member 510 as shown in FIG. 12, the region 510c (FIG. 11) of the lower surface of the cover member 510 is opposite to the upper surface of the rear upper surface portion 412 at a position above the rear upper surface portion 412. Further, the region 510d (FIG. 11) of the lower surface of the cover member 510 is opposite to the upper surface of the central upper surface portion 419 at a position above the central upper surface portion 419. In this state, a nitrogen gas is supplied from the nitrogen gas supply system to the nitrogen gas inlet pipe 529.

As indicated by thick solid arrows in FIG. 12, the nitrogen gas supplied to the nitrogen gas inlet pipe 529 with the opening 412b being open is injected downward from the plurality of injection holes 511 (FIG. 11) of the second nitrogen gas supplier 520 (FIG. 11). The nitrogen gas injected from the plurality of injection holes 511 (FIG. 11) flows into the casing 410 via a position in the vicinity of an inner edge of the opening 412b.

In this case, a downward flow of a nitrogen gas from the lower surface of the cover member 510 is formed along the inner edge portion of the opening 412b. The formed flow of the nitrogen gas cuts off a flow of an atmosphere between a space below the cover member 510 and the outside of the space. Thus, an atmosphere outside of the casing 410 is prevented from entering the casing 410 through the opening 412b. Further, leakage of the ozone generated in the casing 410 to the outside of the casing 410 through the opening 412b is reduced.

Next, the configuration of the light emitter 300 will be described. As shown in FIGS. 7 to 9, the light emitter 300 includes a casing 310, an ultraviolet ray lamp 320 and a third nitrogen gas supplier 330. In each of FIGS. 7 and 9, the casing 310 is indicated by a one-dot and dash line. In FIG. 8, the casing 310, the ultraviolet ray lamp 320 and the third nitrogen gas supplier 330 are indicated by one-dot and dash lines. A driving circuit, a wire, a connection terminal and the like of the ultraviolet ray lamp 320 are stored in the casing 310 together with the ultraviolet ray lamp 320 and the third nitrogen gas supplier 330. The light emitter 300 is controlled by the controller 114 of FIG. 1, for example.

The ultraviolet ray lamp 320 and the third nitrogen gas supplier 330 have a cuboid shape respectively extending in one direction. As indicated by the one-dot dash lines in FIG. 8, measurements in a longitudinal direction of the ultraviolet ray lamp 320 and the third nitrogen gas supplier 330 are equal to each other and are respectively substantially equal to a distance between the one side surface portion 416 and the other side surface portion 417.

In the present example, a xenon excimer lamp that generates vacuum ultraviolet rays having a wavelength of 172 nm is used as the ultraviolet ray lamp 320. The ultraviolet ray lamp 320 may be a lamp that generates vacuum ultraviolet rays having a wavelength of about not less than 120 nm and about not more than 230 nm, and another excimer lamp, a deuterium lamp or the like may be used instead of the xenon excimer lamp.

Figure 13A:
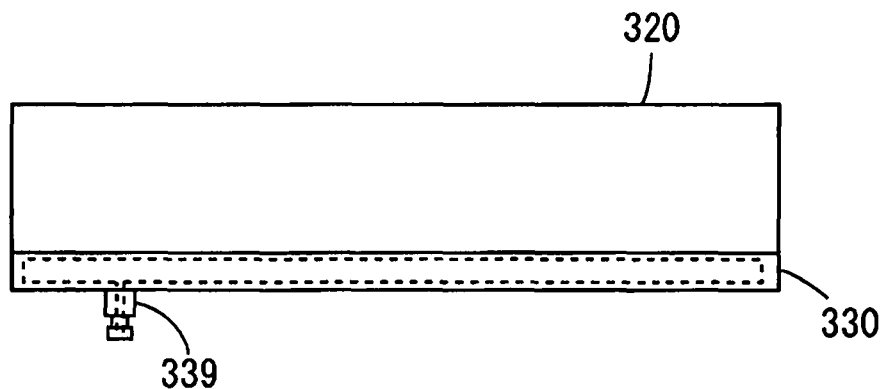
FIG. 13A is a plan view of an ultraviolet ray lamp and a third nitrogen gas supplier.
Figure 13B:
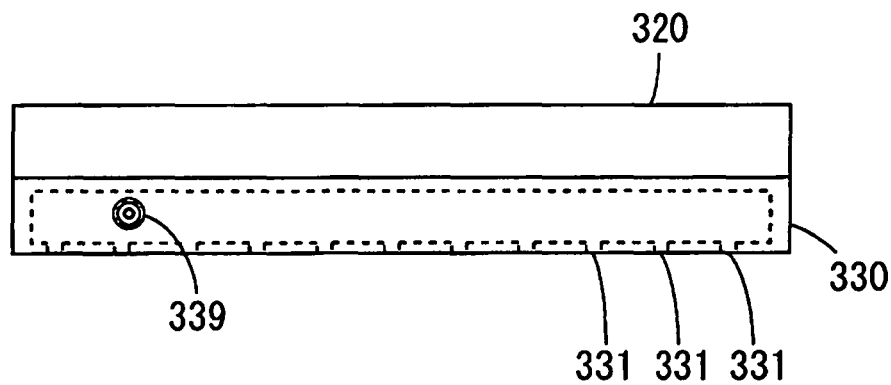
FIG. 13B is a front view of the ultraviolet ray lamp and the third nitrogen gas supplier.
Figure 13C:
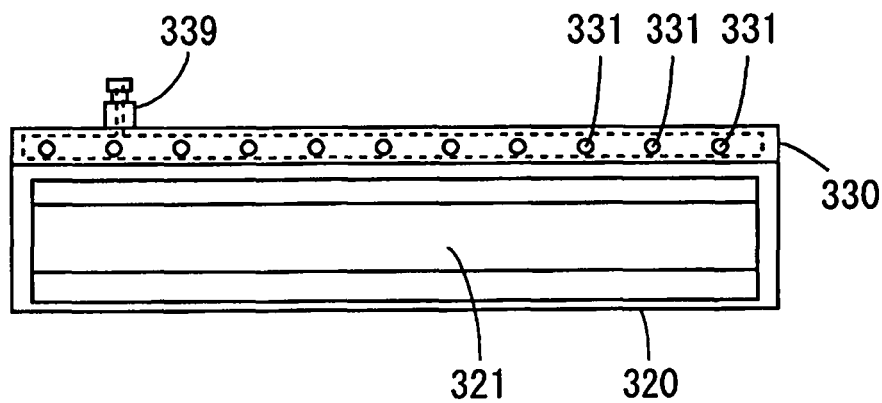
FIG. 13C is a bottom view of the ultraviolet ray lamp and the third nitrogen gas supplier.

FIG. 13(a) is a plan view of the ultraviolet ray lamp 320 and the third nitrogen gas supplier 330, FIG. 13(b) is a front view of the ultraviolet ray lamp 320 and the third nitrogen gas supplier 330, and FIG. 13(c) is a bottom view of the ultraviolet ray lamp 320 and the third nitrogen gas supplier 330.

As shown in FIG. 13C, the emission surface 321 of the vacuum ultraviolet rays is formed at the lower surface of the ultraviolet ray lamp 320 to extend from one end to the other end of the ultraviolet ray lamp 320. During a period in which the ultraviolet ray lamp 320 is turned on, the vacuum ultraviolet rays are emitted downward from the emission surface 321. The vacuum ultraviolet rays emitted from the ultraviolet ray lamp 320 has a strip-shape cross section orthogonal to an advancing direction (the up-and-down direction in the present example). Further, the length of the strip-shape cross section is larger than the diameter of the substrate W.

The ultraviolet ray lamp 320 is arranged such that the strip-shape vacuum ultraviolet rays emitted from the ultraviolet ray lamp 320 cross a moving path of the substrate W placed on the local transport hand 434 of FIG. 8. In this case, the local transport hand 434 (FIG. 8) moves between the rear position P1 (FIG. 8) and the front position P2 (FIG. 8) at a constant moving speed with the strip-shape vacuum ultraviolet rays being emitted from the ultraviolet ray lamp 320 during the neutralization processing, whereby the strip-shape vacuum ultraviolet rays are scanned from one end to the other end of the substrate W. Thus, the entire region of the upper surface of the substrate W is uniformly irradiated with the vacuum ultraviolet rays with a simple configuration.

Further, in this case, the moving speed of the local transport hand 434 (FIG. 8) is adjusted, whereby energy of the vacuum ultraviolet rays (hereinafter referred to as an exposure amount) with which a unit area of the upper surface of the substrate W is irradiated during the neutralization processing can be adjusted. The unit of the exposure amount is represented by "$J/m^2$", for example.

Differences in amount of ozone generated above the substrate W are generated according to exposure amounts. For example, the larger the exposure amount is, the larger the amount of generated ozone is. The smaller the exposure amount is, the smaller the amount of generated ozone is. Therefore, the moving speed of the local transport hand 434 (FIG. 8) is adjusted, whereby an amount of ozone generated above the substrate W can be adjusted. As a result, the entire upper surface of the substrate W can be uniformly and appropriately neutralized.

As shown in FIGS. 13A to 13C, the third nitrogen gas supplier 330 is attached to the lower end of the front surface of the ultraviolet ray lamp 320. The third nitrogen gas supplier 330 has a square tube shape with the both ends closed.

As shown in FIGS. 13B and 13C, a plurality of injection holes 331 are formed in portions directed downward of the third nitrogen gas supplier 330. The plurality of injection holes 331 are arranged at substantially equal intervals from the one end to the other end of the third nitrogen gas supplier 330. Further, one end of a nitrogen gas inlet pipe 339 is connected to a front surface of the third nitrogen gas supplier 330. A nitrogen gas supply system (not shown) is connected to the other end of the nitrogen gas inlet pipe 339.

During the neutralization processing of the substrate W, a nitrogen gas is supplied to the nitrogen gas inlet pipe 339 from the nitrogen gas supply system. The nitrogen gas supplied to the nitrogen gas inlet pipe 339 is dispersively injected into the casing 410 of FIG. 7 from the plurality of injection holes 331 through an inner space of the third nitrogen gas supplier 330.

As shown in FIG. 13(c), the plurality of injection holes 331 are adjacent to the emission surface 321 of the ultraviolet ray lamp 320. Therefore, during the neutralization processing of the substrate W, a nitrogen gas is injected from the plurality of injection holes 331, whereby the oxygen concentration in the path of the vacuum ultraviolet rays with which the substrate W is irradiated can be more sufficiently lowered. Therefore, excessive generation of ozone is more sufficiently suppressed. Further, a nitrogen gas is dispersively supplied to the region above the substrate W irradiated with the vacuum ultraviolet rays, whereby a uniform flow of gas can be formed above the substrate W. Therefore, the ozone generated above the substrate W can be uniformly supplied to the entire upper surface of the substrate W. As a result, the entire upper surface of the substrate can be more uniformly neutralized.

Further, because a nitrogen gas is supplied to the region above the substrate W irradiated with vacuum ultraviolet rays, the supplied nitrogen gas is likely to function as a catalyst of the above-mentioned three-body reaction. Therefore, an appropriate amount of ozone can be efficiently generated.

An amount of vacuum ultraviolet rays with which the upper surface of the substrate W is irradiated from the ultraviolet ray lamp 320 that are absorbed by an atmosphere including oxygen molecules increases as the size of the path of the vacuum ultraviolet rays between the ultraviolet ray lamp 320 and the substrate W increases. Therefore, amounts of ozone generated above the substrate W differ according to the lengths of the path of the vacuum ultraviolet rays. For example, the longer the path of the vacuum ultraviolet rays is, the larger the amount of generated ozone is. The shorter the path of the vacuum ultraviolet rays is, the smaller the amount of generated ozone is. Therefore, when the upper surface of the substrate W is inclined with respect to the emission surface 321 (FIG. 13C) of the ultraviolet ray lamp 320, differences in amount of ozone generated at a plurality of positions above the substrate W are generated.

In the present embodiment, the ultraviolet ray lamp 320 is arranged to extend in a direction orthogonal to the front-and-rear direction in a horizontal plane (hereinafter referred to as a left-and-right direction). Further, the local transport hand 434 is provided to connect the upper ends of the two hand support members 435 as shown in FIG. 9. With the substrate W being placed on the local transport hand 434, the two hand support members 435 are arranged to be opposite to each other with the center of the substrate W being sandwiched therebetween in the left-and-right direction. The two hand support members 435 have a common height, so that the height of the local transport hand 434 is constant in the left-and-right direction in which the two hand support members 435 are arranged.

From these, in the left-and-right direction, the distance between the substrate W placed on the local transport hand 434 and the ultraviolet ray lamp 320 is kept constant. Thus, during the neutralization processing of the substrate W, the entire upper surface of the substrate W is uniformly irradiated with vacuum ultraviolet rays. Therefore, generation of variations in amount of ozone generated at a plurality of positions above the substrate W is prevented. Thus, the entire upper surface of the substrate W can be uniformly neutralized.

[7] Neutralization Conditions

In the present embodiment, in neutralization conditions of the substrate W by the neutralization device OWE, an oxygen concentration in the casing 410 and a moving speed of the substrate W by the local transport hand 434 are included.

The oxygen concentration in the casing 410 during the neutralization processing is set to be lower than 1%, for example. In this case, when the oxygen concentration detected by the oxygen concentration sensor S4 of FIG. 7 is lower than 1%, the neutralization processing is performed on the substrate W. Thus, excessive generation of ozone is suppressed. In the present embodiment, if the oxygen concentration detected by the oxygen concentration sensor S4 of FIG. 7 is not less than 1%, the neutralization processing is not performed on the substrate W.

An exposure amount for the neutralization processing is determined in advance for every substrate W or for every type of the substrate W based on the processing contents for the substrate W. The predetermined exposure amount is stored in the controller 114 of FIG. 1 as the set exposure amount before the neutralization processing of the substrate W.

As described above, when the strip-shape vacuum ultraviolet rays are scanned from one end to the other end of the substrate W at a constant speed, it is possible to adjust the exposure amount of the substrate W by controlling the moving speed of the substrate W. For example, it is possible to reduce the exposure amount by increasing the moving speed of the substrate W, and it is possible to increase the exposure amount by lowering the moving speed of the substrate W. Here, a constant relationship exists among the exposure amount of the substrate W, irradiance of the vacuum ultraviolet rays with which the substrate W is irradiated and the moving speed of the substrate W.

As such, in the present embodiment, the irradiance of the substrate W when the substrate W is irradiated with the vacuum ultraviolet rays during the neutralization processing is detected in advance by the irradiance sensor S3 before the neutralization processing by below-mentioned irradiance measurement. In this case, when letting the irradiance detected by the irradiance sensor S3 be IL (W/m² (=J/sec·m²)), letting the set exposure amount be SA (J/m²), and letting a length of the cross sections of the vacuum ultraviolet rays emitted from the ultraviolet ray lamp 320 in a moving direction of the substrate W (an irradiation width) be EW (m), the moving speed V (m/sec) of the substrate W required to acquire the set exposure amount is expressed by a following formula (1).

$$V=(EW \times IL)/SA \qquad (1)$$

The moving speed of the substrate W is calculated by the controller 114 based on the above-mentioned formula (1). With the vacuum ultraviolet rays being emitted from the light emitter 300, the substrate mover 400 is controlled such that the local transport hand 434 is moved from the front position P2 to the rear position P1 (or from the rear position P1 to the front position P2) at a calculated moving speed.

In this manner, feedback control of the moving speed of the substrate W is performed based on the irradiance detected by the irradiance sensor S3 such that the exposure amount of the substrate W is the set exposure amount. Thus, the feedback control of the moving speed of the substrate W can be performed based on the exposure amount of the vacuum ultraviolet rays with which the substrate W is irradiated such that an appropriate amount of ozone is generated.

[8] Neutralization Processing Operation

FIGS. 14 to 21 are side views for explaining a neutralization processing operation of performing neutralization processing on the substrate W in the neutralization device OWE. In FIGS. 14 to 21, similarly to the side view of FIG. 7, a state of the neutralization device OWE from which the box 60 (FIG. 5) and the other side surface portion 417 (FIG. 5) are detached is shown. In FIGS. 16 to 21, the substrate W is indicated by hatching such that each constituent element of the substrate mover 400 and the substrate W are easily identified from each other.

Figure 14:
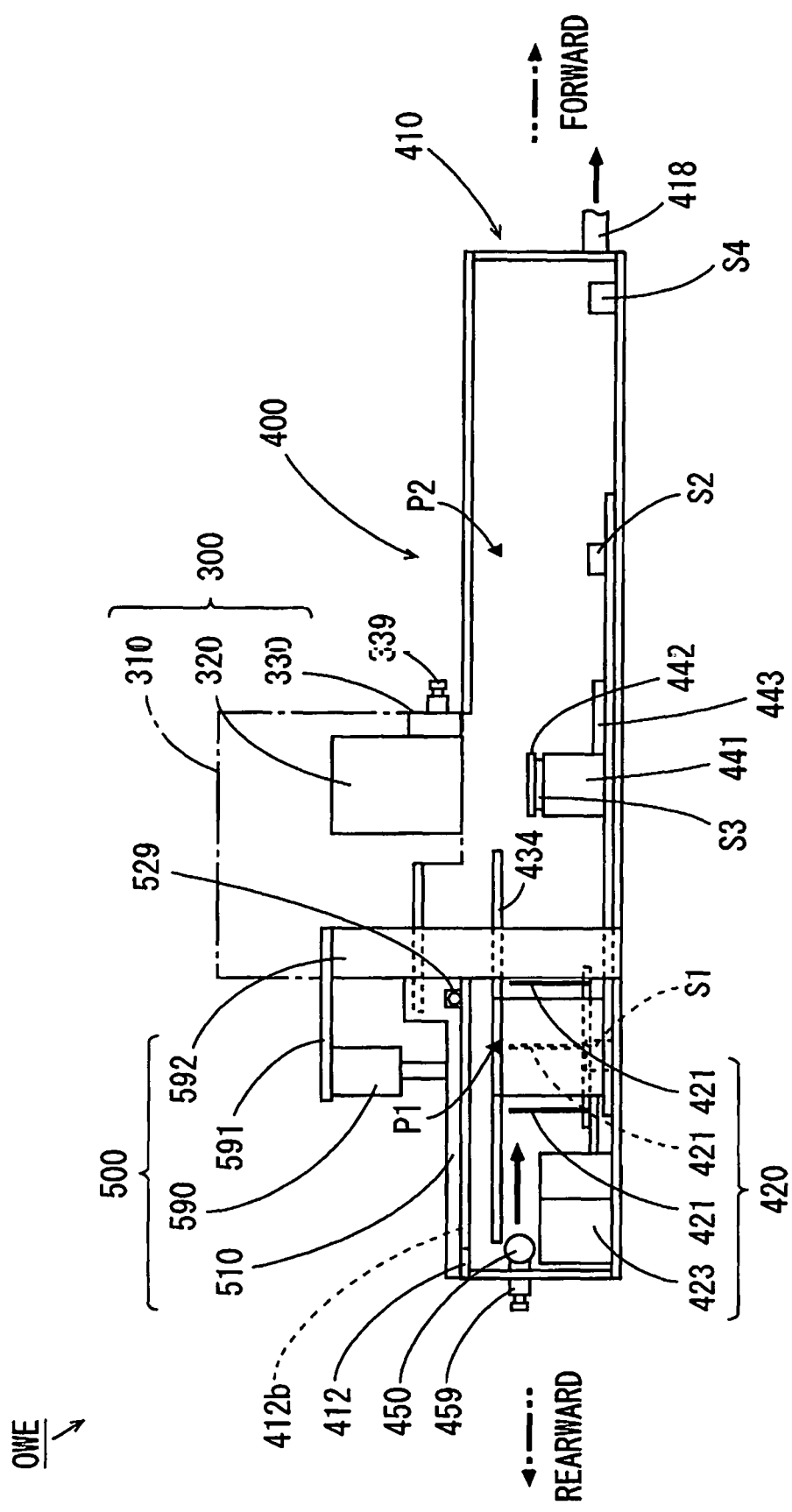
FIG. 14 is a side view for explaining a substrate neutralization processing operation performed in the neutralization device.

In the initial state, as shown in FIG. 14, the local transport hand 434 is located at the rear position P1, and the upper ends of the plurality of lifting lowering pins 421 are located at the waiting positions. Further, the opening 412b of the casing 410 is closed, and the ultraviolet ray lamp 320 is in dii OFF state. Further, as indicated by a thick solid arrow in FIG. 14, a nitrogen gas is supplied from the first nitrogen gas supplier 450 into the casing 410.

A nitrogen gas is supplied from the first nitrogen gas supplier 450 to the inside of the casing 410, so that the oxygen concentration in the casing 410 is lowered. Thus, the oxygen concentration in the casing 410 is kept lower than 1%, for example.

Figure 15:
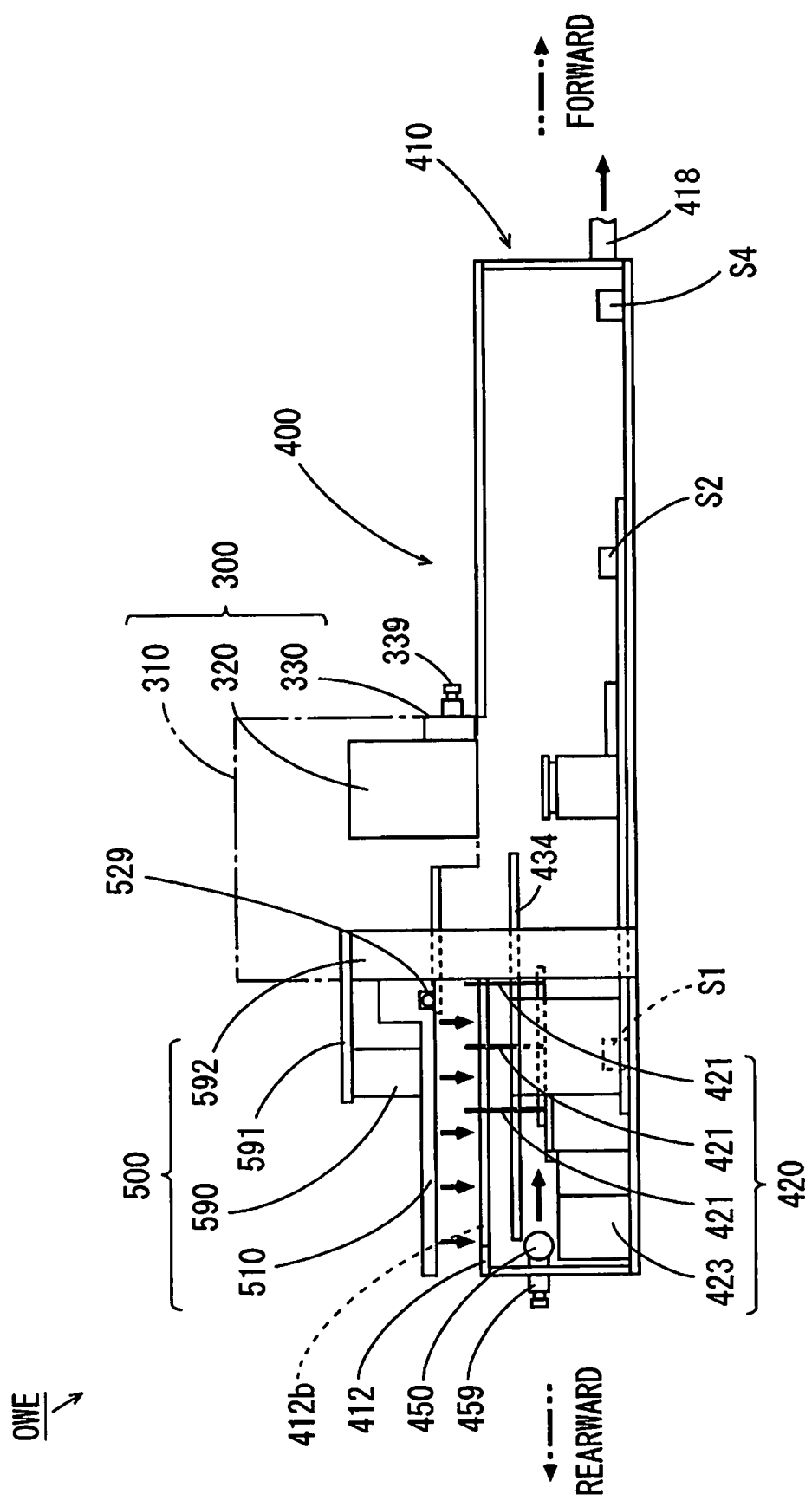
FIG. 15 is a side view for explaining the substrate neutralization processing operation performed in the neutralization device.

As shown in FIG. 15, the opening 412b is opened by lifting of the cover member 510 in order for the substrate W to be carried into the casing 410. At this time, a nitrogen gas is supplied from the lower surface of the cover member 510 to the opening 412b by the second nitrogen gas supplier 520 of FIG. 11 (see FIG. 12). Thus, an atmosphere outside of the casing 410 is prevented from entering the casing 410 through the opening 412b as described above. Further, the plurality of lifting lowering pins 421 of the receiving transferring mechanism 420 are lifted. Thus, the upper ends of the plurality of lifting lowering pins 421 are moved from the waiting positions to the receiving transferring positions.

Figure 16:
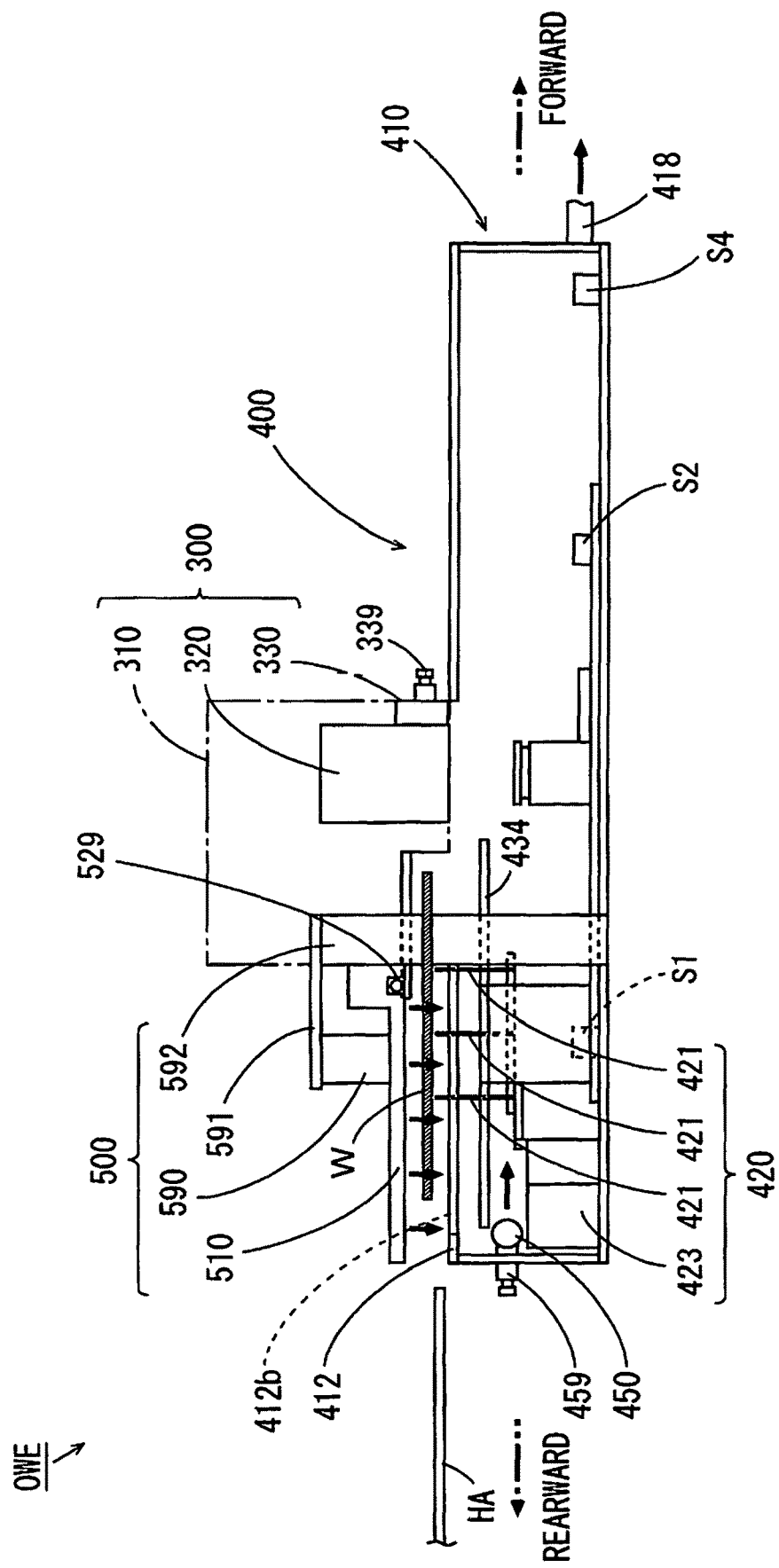
FIG. 16 is a side view for explaining the substrate neutralization processing operation performed in the neutralization device.
Figure 17:
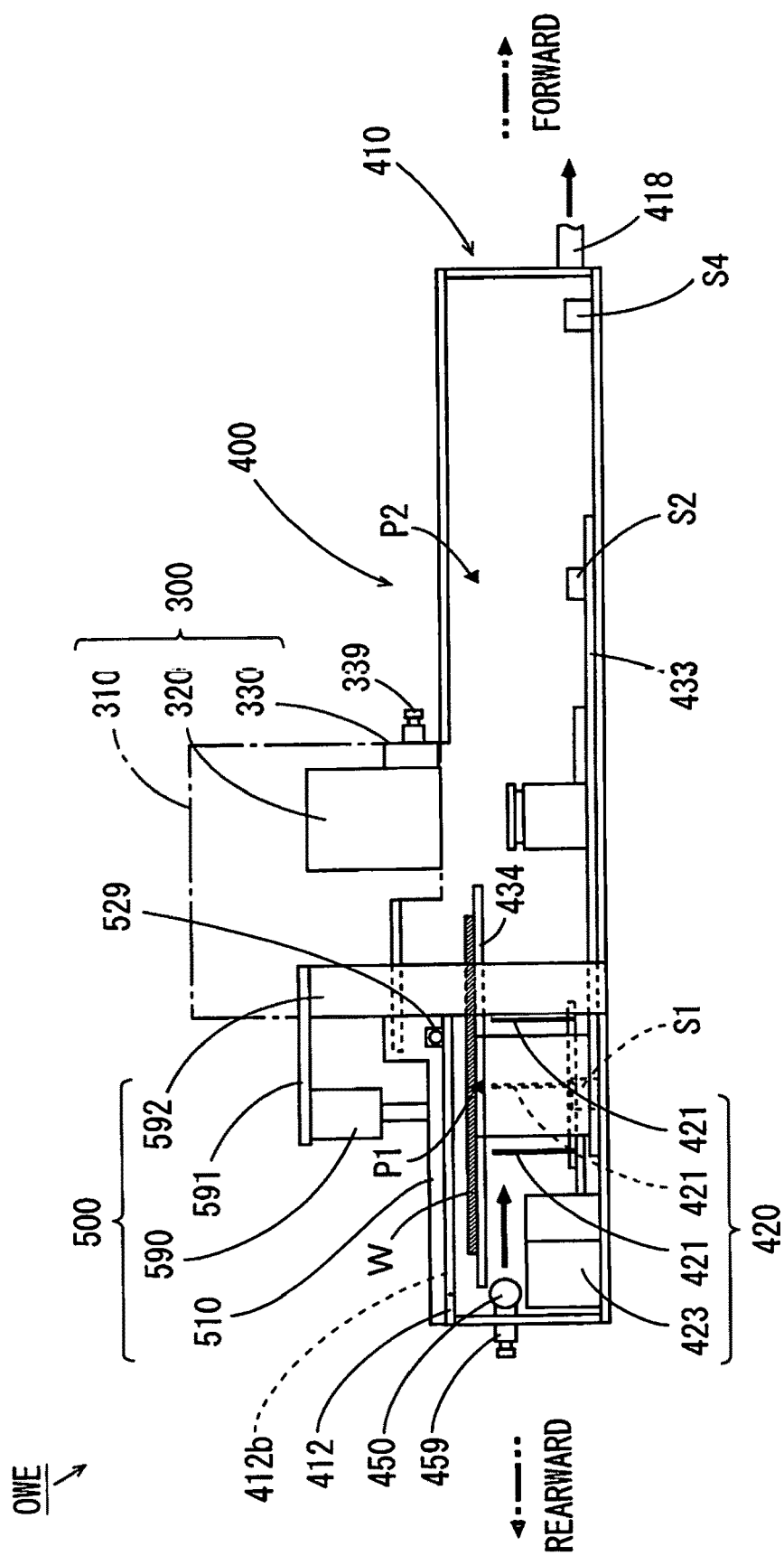
FIG. 17 is a side view for explaining the substrate neutralization processing operation performed in the neutralization device.

Next, as shown in FIG. 16, the substrate W in the horizontal attitude is inserted in a horizontal direction into a gap between the cover member 510 and the opening 412b and placed on the plurality of lifting lowering pins 421 by a hand HA of any of the transport mechanisms 127, 128 of FIG. 4. Subsequently, the plurality of lifting lowering pins 421 of the receiving transferring mechanism 420 are lowered. Thus, as shown in FIG. 17, the upper ends of the plurality of lifting lowering pins 421 are moved from the receiving transferring positions to the waiting positions, and the substrate W in the horizontal attitude is moved to the inside of the casing 410 through the opening 412b. At this time, the substrate W is transferred from the plurality of lifting lowering pins 421 to the local transport hand 434. Further, the cover member 510 is lowered, so that the opening 412b is closed, and the supply of a nitrogen gas by the second nitrogen gas supplier 520 of FIG. 11 is stopped.

Figure 18:
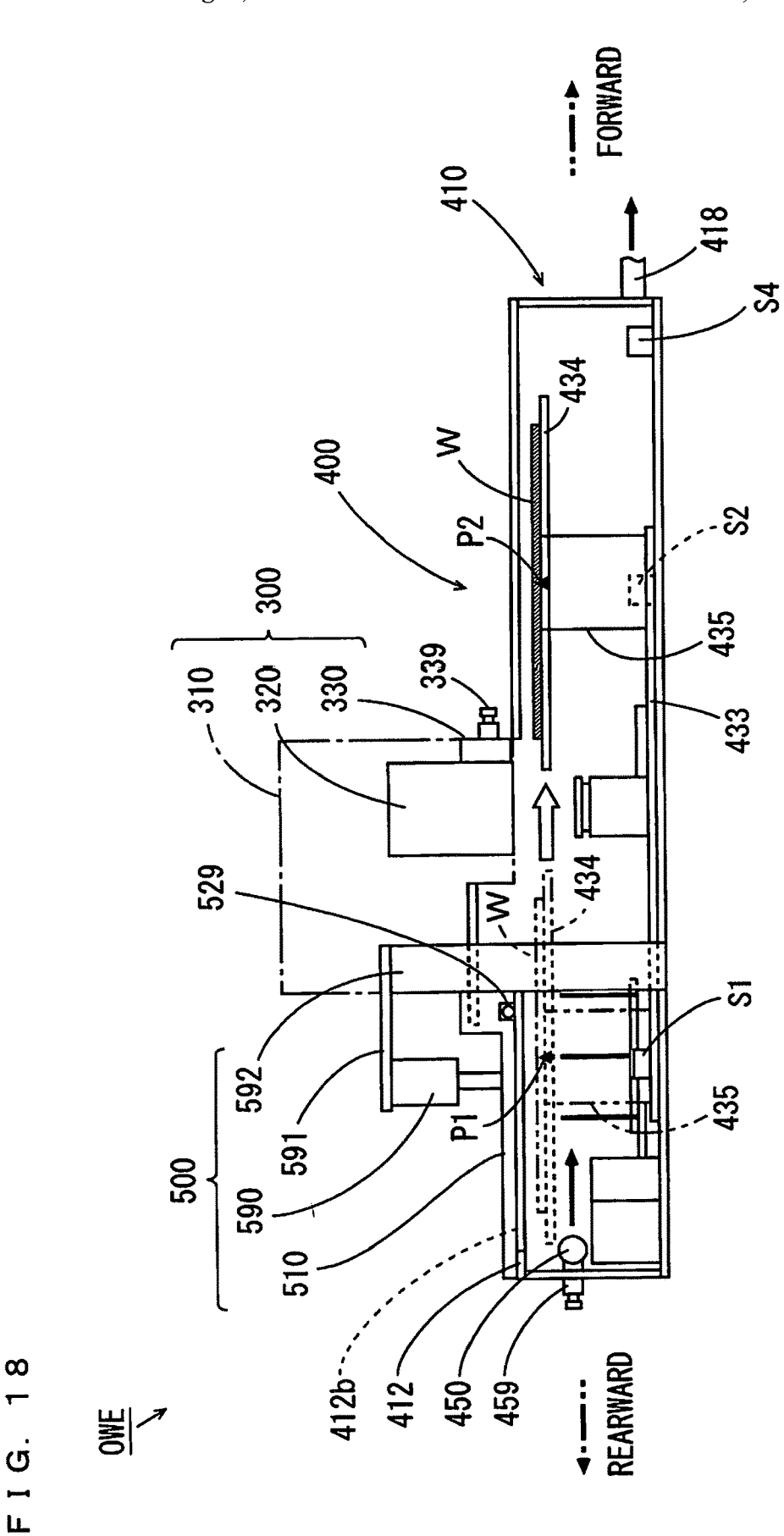
FIG. 18 is a side view for explaining the substrate neutralization processing operation performed in the neutralization device.
Figure 19:
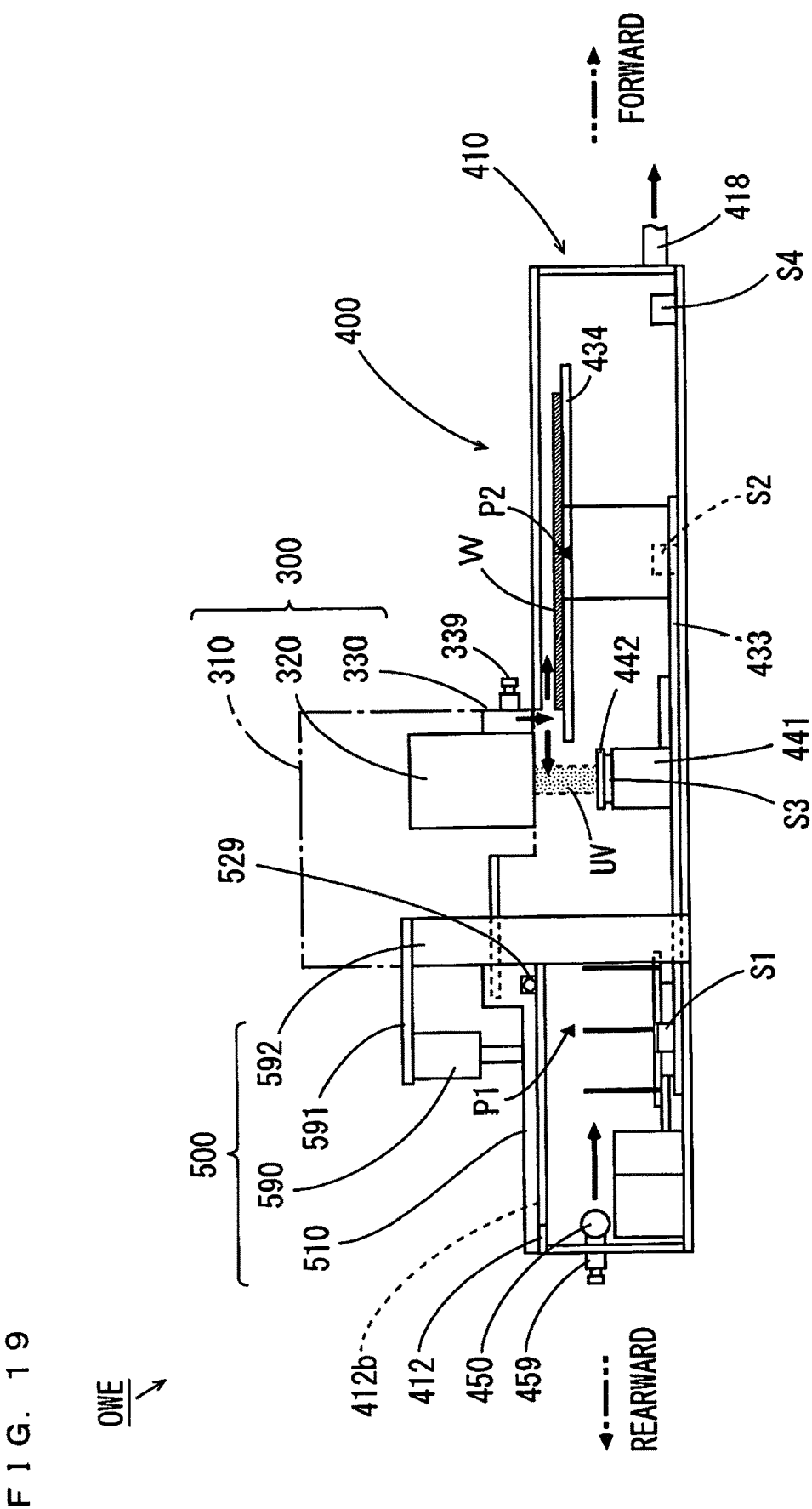
FIG. 19 is a side view for explaining the substrate neutralization processing operation performed in the neutralization device.

Next, as indicated by an outlined arrow in FIG. 18, the local transport hand 434 is moved from the rear position P1 to the front position P2. At this time, the ultraviolet ray lamp 320 is in the OFF state, so that the substrate W is not irradiated with the vacuum ultraviolet rays.

Thereafter, whether the local transport hand 434 is located at the front position P2 is determined by the controller 114 of FIG. 1 based on a result of detection of the front position sensor S2. Further, whether the oxygen concentration detected by the oxygen concentration sensor S4 is lower than 1% is determined by the controller 114.

When the local transport hand 434 is located at the front position P2 and the oxygen concentration is lower than 1%, the ultraviolet ray lamp 320 is switched from the OFF state to an ON state. Thus, as indicated by a dotted pattern in FIG. 19, the vacuum ultraviolet rays UV are emitted downward from the ultraviolet ray lamp 320. The vacuum ultraviolet rays UV have strip-shape cross sections extending in the left-and-right direction as described above. The length of the cross sections of the vacuum ultraviolet rays UV in a direction in parallel to the left-and-right direction is longer than the diameter of the substrate W.

Further, a nitrogen gas is supplied from the third nitrogen gas supplier 330 into the casing 410. The nitrogen gas supplied from the third nitrogen gas supplier 330 collides with part of the local transport hand 434 or part of the substrate W, and flows in a space above the substrate W.

Figure 20:
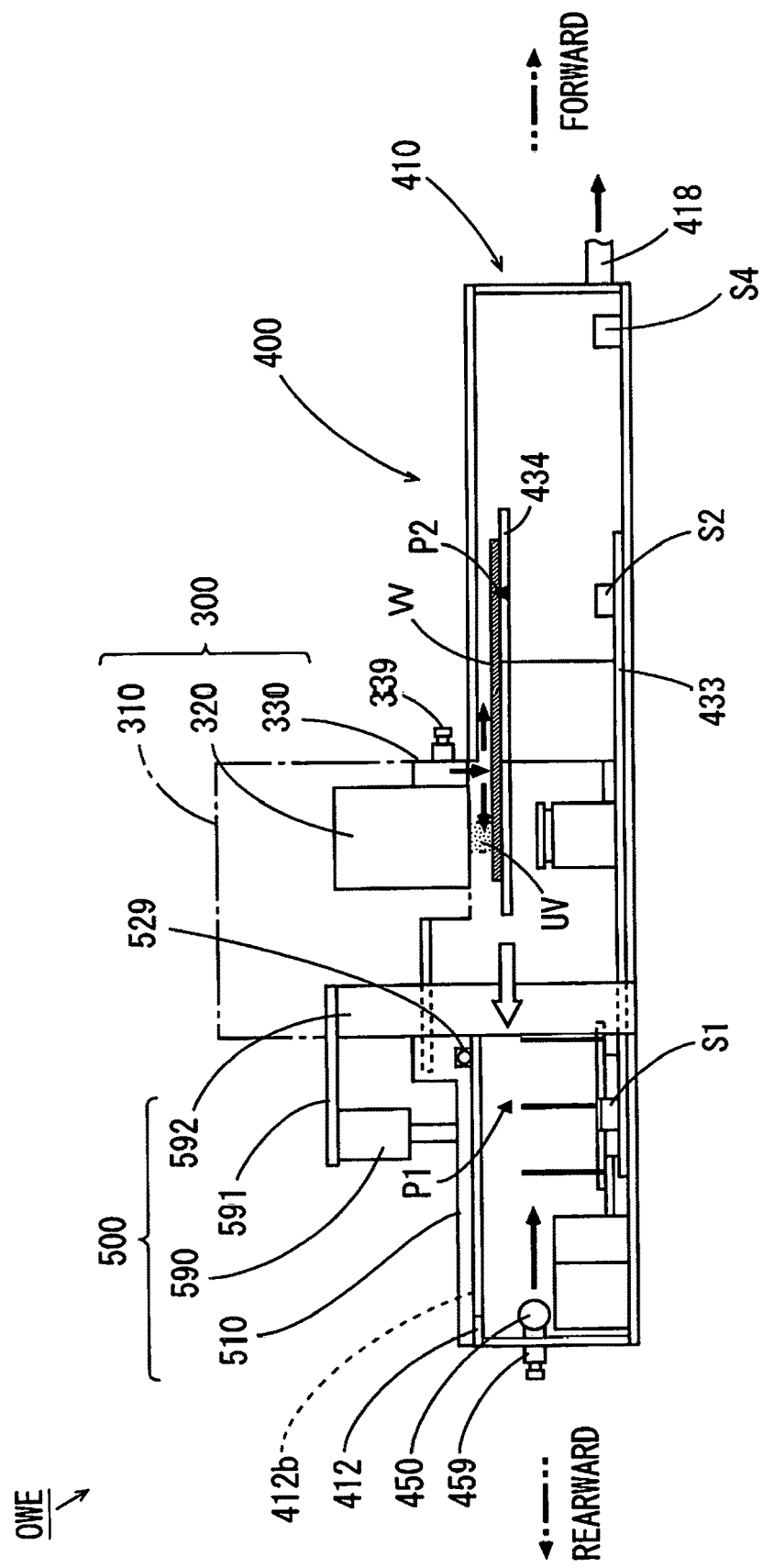
FIG. 20 is a side view for explaining the substrate neutralization processing operation performed in the neutralization device.

Then, as indicated by an outlined arrow in FIG. 20, the local transport hand 434 is moved from the front position P2 to the rear position P1. The moving speed at this time is controlled to be constant and the speed calculated in advance with use of the above-mentioned formula (1). Thus, the substrate W is irradiated with the vacuum ultraviolet rays UV such that the exposure amount of the entire region of the upper surface of the substrate W is the set exposure amount, and the substrate W is neutralized.

Thereafter, whether the local transport hand 434 is located at the rear position P1 is determined by the controller 114 of FIG. 1 based on the result of detection of the rear position sensor S1. When the local transport hand 434 is located at the rear position P1, the ultraviolet ray lamp 320 is switched from the ON state to the OFF state. Further, the supply of a nitrogen gas by the third nitrogen gas supplier 330 is stopped. The state of the neutralization device OWE at this time is the same as the example of FIG. 17.

Figure 21:
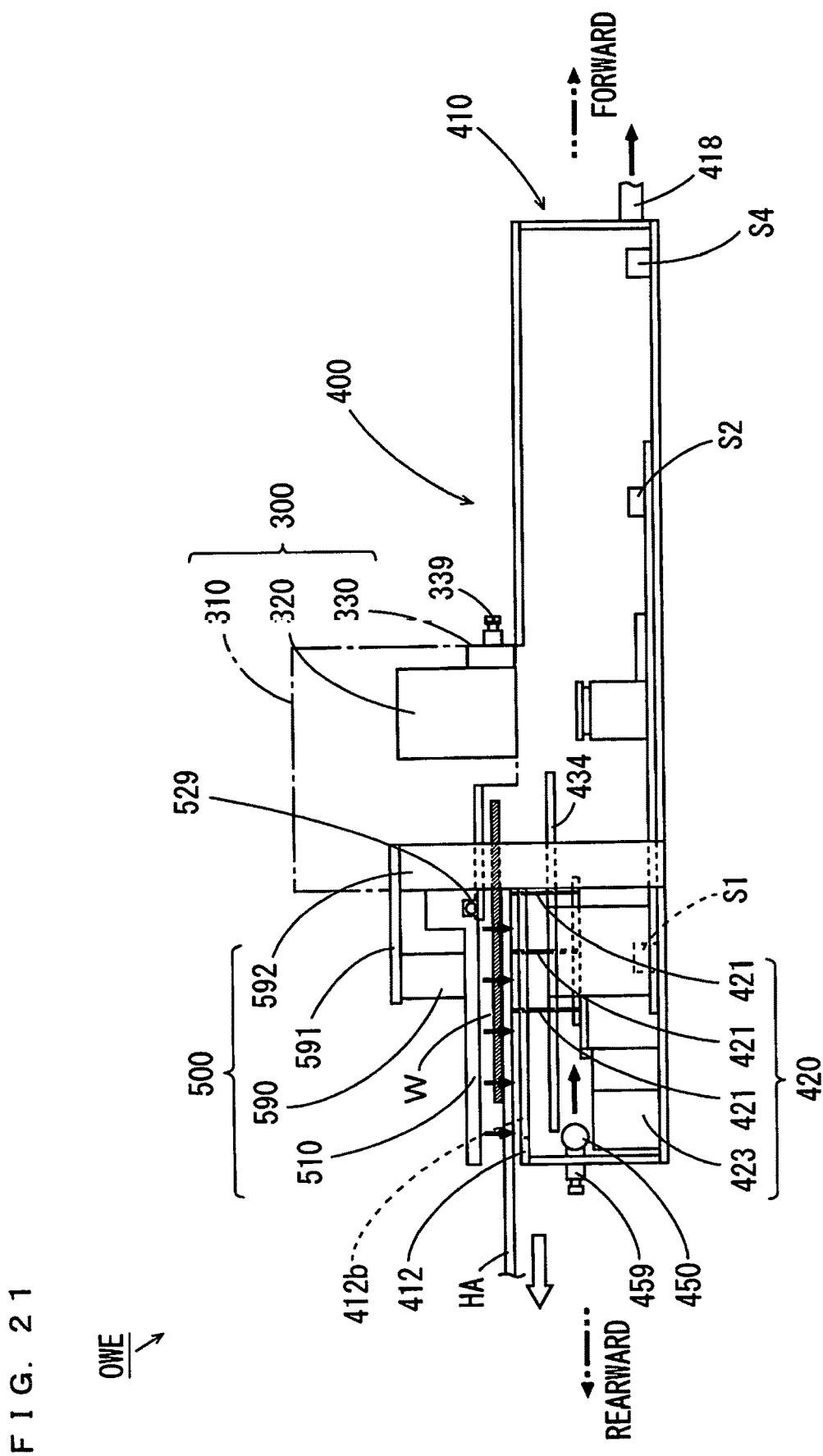
FIG. 21 is a side view for explaining the substrate neutralization processing operation performed in the neutralization device.

Then, the opening 412*b* is opened by lifting of the cover member 510 as shown in FIG. 21 in order for the substrate W to be carried out from the casing 410. At this time, a nitrogen gas is supplied from the lower surface of the cover member 510 to the opening 412*b* by the second nitrogen gas supplier 520 of FIG. 11 (see FIG. 12). Further, the plurality of lifting lowering pins 421 of the receiving transferring mechanism 420 are lifted. Thus, the upper ends of the plurality of lifting lowering pins 421 are moved from the waiting positions to the receiving transferring positions, and the substrate W is transferred from the local transport hand 434 to the plurality of lifting lowering pins 421. In this manner, the substrate W in the horizontal attitude is moved from inside of the casing 410 to a position above the opening 412*b*.

The substrate W on which the neutralization processing has been performed and which is placed on the plurality of lifting lowering pins 421 is taken out in the horizontal direction by the hand HA of any of the transport mechanisms 127, 128 of FIG. 4. Thereafter, the plurality of lifting lowering pins 421 of the receiving transferring mechanism 420 are lowered, and the cover member 510 is lowered, whereby the opening 412*b* is closed. Further, the supply of a nitrogen gas by the second nitrogen gas supplier 520 of FIG. 11 is stopped. Thus, the neutralization device OWE returns to the initial state.

[9] Irradiance Measurement Operation

In order to acquire the set speed used for the neutralization processing of the substrate W, irradiance measurement, shown below, is performed every time the neutralization processing of the predetermined number of substrates W is performed, every lot of the substrates W, or every day, for example.

Figure 22:
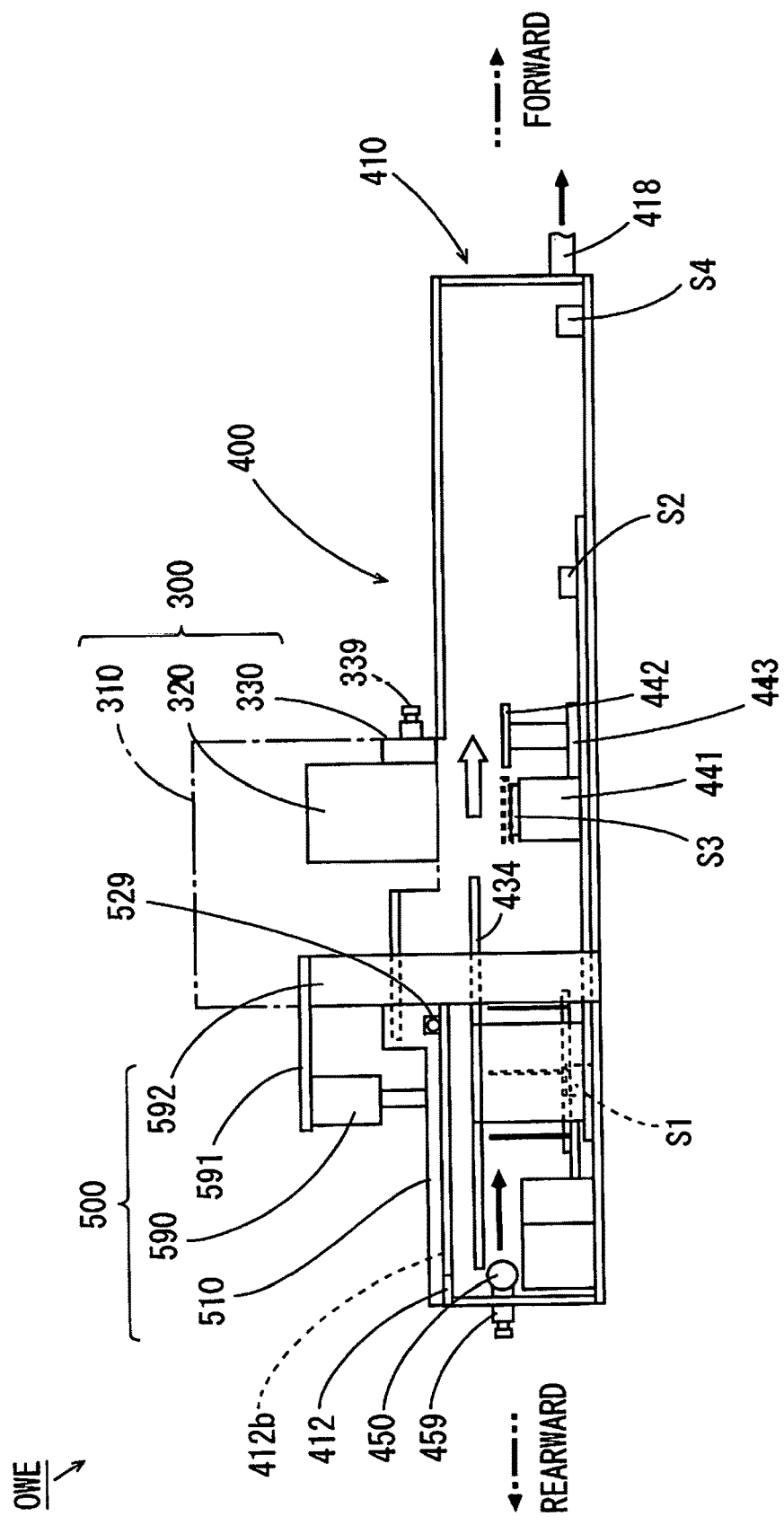
FIG. 22 is a side view for explaining an irradiance measurement operation performed in the neutralization device.
Figure 23:
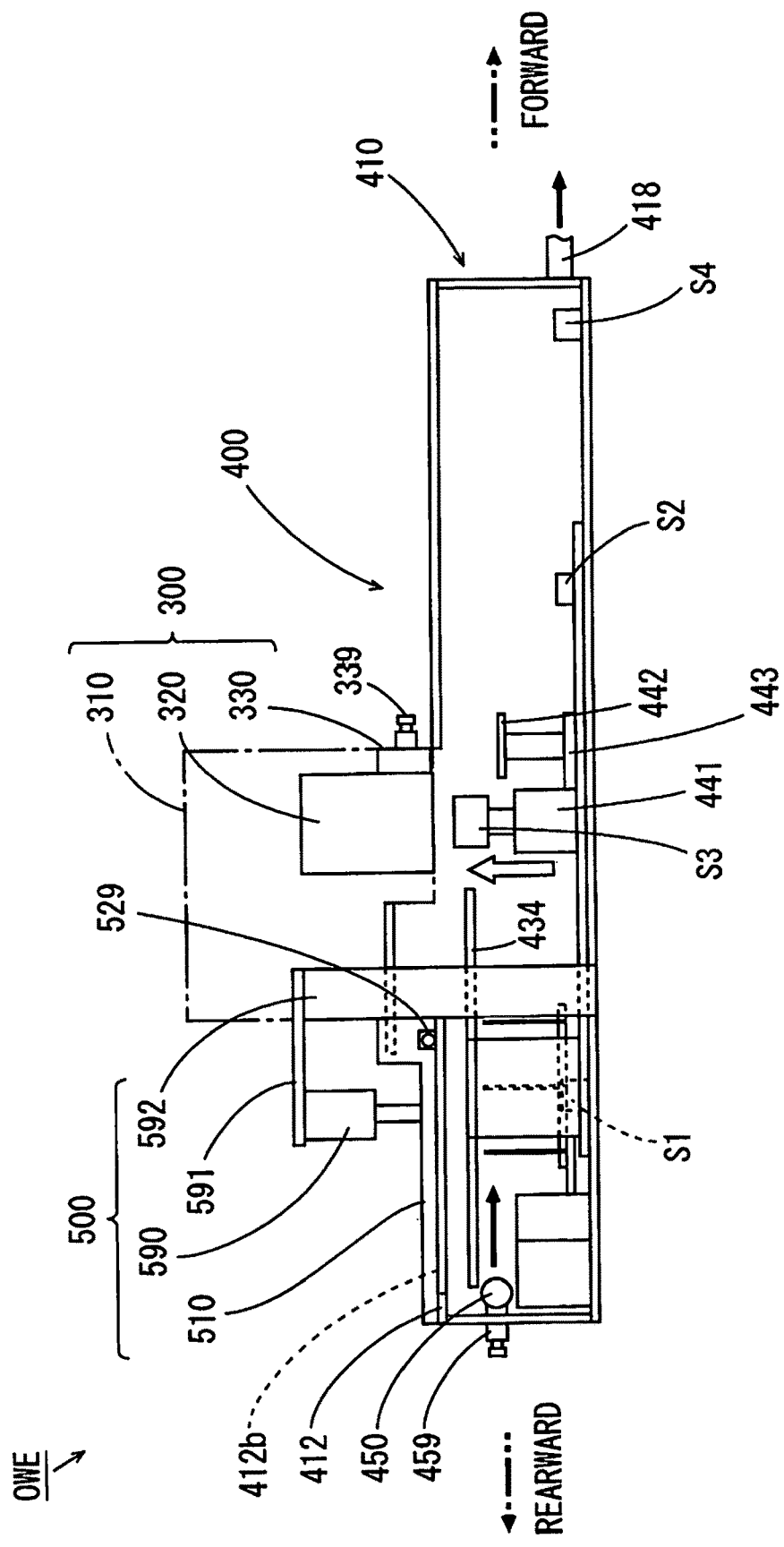
FIG. 23 is a side view for explaining the irradiance measurement operation performed in the neutralization device.

FIGS. 22 to 24 are side views for explaining an irradiance measurement operation in the neutralization device OWE. In FIGS. 22 to 24, similarly to the side view of FIG. 7, a state of the neutralization device OWE from which the box 60 (FIG. 5) and the other side surface portion 417 (FIG. 5) are detached is shown.

In the neutralization device OWE, as indicated by the thick dotted line in FIG. 22, the light blocking member 442 is arranged to cover the upper end of the irradiance sensor S3 during a period in which the irradiance measurement is not carried out. Thus, light is not incident on the light receiving element of the irradiance sensor S3 during irradiation of the substrate W with the vacuum ultraviolet rays (during the neutralization processing). Therefore, deterioration of the irradiance sensor S3 is suppressed, and prolongation of the useful life of the irradiance sensor S3 is realized. Further, the irradiance sensor S3 is arranged at a position farther downward than the moving path of the local transport hand 434.

The irradiance measurement is started when the opening 412*b* of the casing 410 is closed and the oxygen concentration detected by the oxygen concentration sensor S4 is lower than 1%. In the initial state, the ultraviolet ray lamp 320 is in the OFF state.

When the irradiance measurement is started, the light blocking member 442 is moved forward by the light blocking driver 443 as indicated by an outlined arrow in FIG. 22. Thus, the light receiving surface provided at the upper end of the irradiance sensor S3 is exposed upward.

Next, as indicated by an outlined arrow in FIG. 23, the irradiance sensor S3 is lifted by the sensor lifting lowering driver 441. At this time, the irradiance sensor S3 is positioned such that the height of the light receiving surface coincides with the height of the upper surface of the substrate W placed on the local transport hand 434.

Then, the ultraviolet ray lamp 320 is switched from the OFF state to the ON state. Thus, as indicated by a dotted pattern in FIG. 24, the strip-shape vacuum ultraviolet rays UV are emitted from the ultraviolet ray lamp 320 to the irradiance sensor S3.

Part of the vacuum ultraviolet rays UV emitted from the ultraviolet ray lamp 320 are incident on the light receiving element of the irradiance sensor S3. Thus, the irradiance of the vacuum ultraviolet rays with which the substrate W is irradiated during the neutralization processing is detected. A result of detection of irradiance is supplied to the controller 114 of FIG. 1.

Thereafter, the irradiance sensor S3 is lowered, and the ultraviolet ray lamp 320 is switched from the ON state to the OFF state. Further, the light blocking member 442 is moved rearward to cover the upper end of the irradiance sensor S3. Thus, the neutralization device OWE returns to the initial state.

As described above, the irradiance sensor S3 is positioned such that the height of the light receiving surface coincides with the height of the upper surface of the substrate W placed on the local transport hand 434 during the irradiance measurement. Therefore, the irradiance of the vacuum ultraviolet rays with which the substrate W is irradiated during the neutralization of the substrate W can be accurately detected.

Further, the irradiance sensor S3 is arranged at a position farther downward than the moving path of the local transport hand 434 during the neutralization processing of the substrate W. Thus, the irradiance sensor S3 does not interfere with the substrate W during the neutralization processing.

[10] Effects (1) In the above-mentioned substrate processing apparatus 100, the neutralization processing is performed on the substrate W by the neutralization device OWE. In the neutralization device OWE, the upper surface of the substrate W is irradiated with the vacuum ultraviolet rays emitted by the light emitter 300 while the local transport hand 434 on which the substrate W is placed is moved with respect to the light emitter 300.

At this time, oxygen molecules included in the atmosphere above the substrate W is decomposed by the photodissociation, and an oxygen atom generated by decomposition is coupled with an oxygen molecule present in the surroundings. Thus, ozone is generated. The generated ozone comes into contact with the substrate W, so that the entire substrate is neutralized to be close to 0 (V).

In the plurality of coating processing units 129 provided in the coating processing section 121 and the coating development processing section 131, the film of the processing liquid is formed on the substrate W on which the neutralization processing has been performed. In this case, because the electrical potential of the substrate W on which the neutralization processing has been performed is substantially 0 (V), an occurrence of a processing defect caused by electrification during the coating processing is prevented.

(2) In the neutralization device OWE, the substrate W in a horizontal attitude can be inserted in the horizontal direction into a gap between the cover member 510 and the opening 412*b* when the cover member 510 is located above the opening 412*b*. The substrate W is moved from a position above the opening 412*b* to a position inside of the casing 410 through the opening 412*b* by the receiving transferring mechanism 420. Thereafter, the cover member 510 is lowered from the position above the opening 412*b*, so that the opening 412*b* is closed. In this state, a nitrogen gas is supplied from the first nitrogen gas supplier 450 into the casing 410, so that an oxygen concentration in the casing 410 is lowered.

The upper surface of the substrate W is irradiated with vacuum ultraviolet rays by the light emitter 300 while the substrate W is moved in the horizontal direction by the local transport mechanism 430. Thus, the substrate W is neutralized. Thereafter, the cover member 510 is lifted to the position above the opening 412*b*, so that the opening 412*b* is opened. In this state, the substrate W Is moved to a position above the opening 412*b* through the opening 412*b* from the position inside of the casing 410. Thereafter, the substrate W in the horizontal attitude can be taken out in the horizontal direction from the gap between the cover member 510 and the opening 412*b*.

The above-mentioned configuration enables the casing 410 to be in a hermetic state or an open state by up-down movement of the cover member 510. In this case, it is possible to open and close the opening 412*b* without sliding the cover member 510 and the casing 410, so that particles are not generated. Further, even when the distance between the opening 412*b* and the cover member 510 is short, the substrate W in the horizontal attitude can be carried in and carried out. Thus, a large space for moving the lid member 510 to an upper portion of the casing 410 is not necessary.

Further, leakage of the ozone generated in the casing 410 during carry-in and carry-out of the substrate can be minimized. Further, the substrate W in the horizontal attitude can be moved to the inside of the casing 410, and the substrate W in the horizontal attitude can be moved to the outside of the casing 410, by the up-down movement of the substrate W. Further, the substrate W in the horizontal attitude can be moved in the horizontal direction in the casing 410. In this case, the mechanism for moving the substrate W is not complicated. As a result, it is possible to neutralize the substrate W in an atmosphere having a constant low oxygen concentration without complicating the configuration for carrying in and carrying out the substrate W.

[11] Neutralization Test

The inventors of the present invention conducted a test regarding how much the substrate W is neutralized by the neutralization processing with use of the above-mentioned neutralization device OWE. Specifically, the neutralization processing was performed on the substrate W having the average electrical potential of −3.29 (V), the maximum electrical potential of 10.33 (V) and the minimum electrical potential of −8.77 (V) in the initial state under respective three neutralization conditions with different set exposure amounts. Here, the average electrical potential indicates the average electrical potential of the all regions in the case where the substrate W is divided into a plurality of unit regions, the maximum electrical potential indicates the electrical potential of the region indicating the maximum electrical potential out of the plurality of unit regions of the substrate W, and the minimum electrical potential indicates the electrical potential of the region indicating the minimum electrical potential out of the plurality of unit regions of the substrate W.

The set exposure amounts of the three neutralization conditions were 200 (mJ/cm$^2$), 600 (mJ/cm$^2$) and 1000 (mJ/cm$^2$), respectively.

As a result, the average electrical potential, the maximum electrical potential and the minimum electrical potential of the substrate W on which the neutralization processing has been performed with the set exposure amount being 200 (mJ/cm$^2$) were −1.34 (V), 1.70 (V) and −6.09 (V), respectively. Further, the average electrical potential, the maximum electrical potential and the minimum electrical potential of the substrate W on which the neutralization processing has been performed with the set exposure amount being 600 (mJ/cm$^2$) were −0.01 (V), 1.69 (V) and −3.50 (V), respectively. Further, the average electrical potential, the maximum electrical potential and the minimum electrical potential of the substrate W on which the neutralization has been performed with the set exposure amount being 1000 (mJ/cm$^2$) were 0.61 (V), 1.69 (V) and −0.98 (V), respectively.

Results of the above-mentioned test are shown in [Table 1] below.

TABLE 1

|  | INITIAL STATE | SET EXPOSURE AMOUNT 200 (mJ/cm$^2$) | SET EXPOSURE AMOUNT 600 (mJ/cm$^2$) | SET EXPOSURE AMOUNT 1000 (mJ/cm$^2$) |
|---|---|---|---|---|
| AVERAGE ELECTRICAL POTENTIAL (V) | −3.29 | −1.34 | −0.01 | 0.61 |
| MAXIMUM ELECTRICAL POTENTIAL (V) | 10.33 | 1.70 | 1.69 | 1.69 |
| MINIMUM ELECTRICAL POTENTIAL (V) | −8.77 | −6.09 | −3.50 | −1.98 |

According to the above-mentioned results of the test, it is found that the larger the set exposure amount is, the less variations in electrical potential in the plurality of unit regions of the substrate W are generated. It is also found that the larger the set exposure amount is, the closer the electrical potential of the entire substrate W becomes to 0.

In this manner, it was found that, even when the substrate W is electrically charged to about ±10(V), the substrate W can be neutralized in the neutralization processing performed by the neutralization device OWE such that the electrical potential of the entire substrate W becomes closer to 0 (V).

The inventors of the present invention have also conducted a test regarding how much the substrate W is neutralized by the neutralization processing with use of a conventional ionizer in addition to the above-mentioned neutralization test. The conventional ionizer used in the test is configured to generate ions between two electrodes and spray the generated ions onto the substrate W.

In the initial state, the neutralization processing was performed by the conventional ionizer on the substrate W, the average electrical potential, the maximum electrical potential and the minimum electrical potential of which were −2.56 (V), 13.75 (V) and −8.16 (V), respectively. As a result, the average electrical potential, the maximum electrical potential and the minimum electrical potential of the substrate W on which the neutralization processing has been performed by the conventional ionizer were −2.67 (V), 12.60 (V) and −8.25 (V), respectively.

From this result, it was found that the substrate W that is charged to about ±10 (V) can hardly be neutralized in the neutralization processing with the use of the conventional ionizer.

[12] Other Embodiments (1) While the upper surface of the substrate W is irradiated with vacuum ultraviolet rays only in the case where the local transport hand 434 is moved from the front position P2 to the rear position P1 in the above-mentioned embodiment, the present invention is not limited to this. The upper surface of the substrate W may be irradiated with vacuum ultraviolet rays only in the case where the local transport hand 434 is moved from the rear position P1 to the front position P2 instead of the case where the local transport hand 434 is moved from the front position P2 to the rear position P1.

Further, the upper surface of the substrate W may be irradiated with vacuum ultraviolet rays in both of the case where the local transport hand 434 is moved from the rear position P1 to the front position P2 and the case where the local transport hand 434 is moved from the front position P2 to the rear position P1.

(2) While vacuum ultraviolet rays are used as the light that separates an oxygen molecule into two oxygen atoms in the above-mentioned embodiment, the present invention is not limited to this. If an oxygen molecule can be separated into two oxygen atoms, the substrate W may be irradiated with the light having a wavelength shorter than that of vacuum ultraviolet rays.

(3) While a nitrogen gas is used to lower the oxygen concentration in the casing 410 in the above-mentioned embodiment, the present invention is not limited to this. An argon gas, a helium gas or the like may be used in the casing 410 instead of a nitrogen gas.

(4) While the second nitrogen gas supplier 520 is provided in the cover member 510 in the above-mentioned embodiment, the second nitrogen gas supplier 520 does not have to be provided. In this case, the number of members in the neutralization device OWE is reduced.

(5) While the third nitrogen gas supplier 330 is provided in the light emitter 300 in the above-mentioned embodiment, the third nitrogen gas supplier 330 does not have to be provided. In this case, the number of members of the neutralization device OWE is reduced.

(6) In the above-mentioned embodiment, the local transport hand 434 is moved in the horizontal direction with the strip-shape vacuum ultraviolet rays emitted by the ultraviolet rays lamp 320, whereby the strip-shape vacuum ultraviolet rays are scanned from one end to the other end of the substrate W. However, the present invention is not limited to this. The strip-shape vacuum ultraviolet rays may be scanned from the one end to the other end of the substrate W when the ultraviolet rays lamp 320 move above the substrate W in the horizontal direction with the substrate W placed on the fixed platform. In this case, it is possible to adjust an amount of ozone generated above the substrate W by adjusting the moving speed of the ultraviolet ray lamp 320.

[13] Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the neutralization device OWE is an example of a neutralizer, the plurality of coating processing units 129 provided in the coating processing section 121 and the coating development processing section 131 are an example of a coater, the controller 114 is an example of a controller, the local transport hand 434 is an example of a holder, the light emitter 300 is an example of an emitter, the feed shaft 431, the feed shaft motor 432, the two guide rails 433, the two hand support members 435 and the coupling member 439 are examples of a relative mover, and the substrate processing apparatus 100 is an example of a substrate processing apparatus.

Further, the casing 410 is an example of a casing, the first nitrogen gas supplier 450 is an example of a first nitrogen gas supplier, and the oxygen concentration sensor S4 is an example of a concentration detector.

Further, the opening 412b is an example of an opening, the upper surfaces of the rear upper surface portion 412 and the central upper surface portion 419 are examples of an upper surface, the cover member 510 is an example of a closing member, the cover driver 590 is an example of an opening closing driver, the receiving transferring mechanism 420 is an example of a substrate moving mechanism, and the second nitrogen gas supplier 520 is an example of a second nitrogen gas supplier.

Further, the box 60 is an example of a box, the gas exhaust port 70 is an example of a gas exhaust port, the third nitrogen gas supplier 330 is an example of a third nitrogen gas supplier and the irradiance sensor S3 is an example of an irradiance detector.

As each of constituent elements recited in the claims, various other elements having configurations or functions described in the claims can be also used.

INDUSTRIAL APPLICABILITY

The present invention can be effectively utilized for neutralization processing of various types of substrates.

The invention claimed is:
1. A substrate processing apparatus comprising:
a neutralizer that performs neutralization processing on a substrate;
a coater that applies a processing liquid to one surface of the substrate that has been neutralized by the neutralizer to form a film of the processing liquid on the one surface of the substrate; and
a controller, wherein
the neutralizer includes a holder that holds the substrate in an atmosphere including oxygen molecules, an emitter that emits vacuum ultraviolet rays, and a relative mover that moves at least one of the holder and the emitter relative to another one in one direction, and the controller is configured to control the emitter and the relative mover such that the one surface of the substrate held by the holder is irradiated with the vacuum ultraviolet rays emitted by the emitter through the atmosphere.

2. The substrate processing apparatus according to claim 1, wherein the controller controls relative moving speeds of the holder and the emitter moved by the relative mover such that the substrate is irradiated with a predetermined light amount of the vacuum ultraviolet rays.

3. The substrate processing apparatus according to claim 1, wherein the neutralizer further includes a casing that stores the holder and the substrate held by the holder, a first nitrogen gas supplier that supplies a nitrogen gas into the casing, and a concentration detector that detects an oxygen concentration in the casing, the emitter is attached to the casing such that the one surface of the substrate held by the holder is irradiated with the emitted vacuum ultraviolet rays in the casing, and the controller controls the emitter and the relative mover such that the substrate is irradiated with the vacuum ultraviolet rays emitted by the emitter when the oxygen concentration detected by the concentration detector is equal to or lower than a predetermined processing concentration.

4. The substrate processing apparatus according to claim 3, wherein the casing further stores the relative mover and has an upper surface in which an opening is formed, the neutralizer further includes a closing member that is provided to be movable in an up-and-down direction between a first position spaced apart from the opening and a second position at which the closing member closes the opening, an opening closing driver that moves the closing member to the first position or the second position, and a substrate moving mechanism that moves the substrate in a horizontal attitude in the up-and-down direction between a position below the closing member and above the opening, and a position in the casing when the closing member is located at the first position, the relative mover moves the substrate held by the holder in a horizontal direction regarded as the one direction in the casing, and the first nitrogen gas supplier supplies a nitrogen gas into the casing when the closing member is located at the second position.

5. The substrate processing apparatus according to claim 4, wherein a lower surface of the closing member comes into contact with a region surrounding the opening of the upper surface of the casing when the closing member is located at the second position.

6. The substrate processing apparatus according to claim 4, wherein the neutralizer further includes a second nitrogen gas supplier that forms a flow of the nitrogen gas between a lower surface of the closing member and an edge of the opening when the closing member is located at the first position.

7. The substrate processing apparatus according to claim 3, wherein the neutralizer further includes a box that stores the casing and the emitter, and a gas exhaust port that exhausts an atmosphere in the casing.

8. The substrate processing apparatus according to claim 1, wherein the neutralizer further includes a third nitrogen gas supplier that supplies a nitrogen gas dispersively to a region above the substrate irradiated with the vacuum ultraviolet rays by the emitter.

9. The substrate processing apparatus according to claim 1, wherein the relative mover moves the holder in the one direction, and the emitter is configured to be able to emit vacuum ultraviolet rays having strip-shape cross sections having a length larger than a diameter of the substrate, and is arranged such that the vacuum ultraviolet rays emitted from the emitter cross a moving path of the substrate held by the holder.

10. The substrate processing apparatus according to claim 1, wherein the neutralizer further includes an illumination intensity detector that detects illumination intensity of the substrate irradiated with light by the emitter, and the controller calculates a moving speed based on the illumination intensity detected by the illumination intensity detector such that a predetermined amount of light is emitted towards the substrate, and controls the relative mover such that the holder and the emitter relatively move at a calculated moving speed.

* * * * *